United States Patent [19]

Erickson

[11] Patent Number: 5,366,695
[45] Date of Patent: Nov. 22, 1994

[54] SINGLE CRYSTAL NICKEL-BASED SUPERALLOY

[75] Inventor: Gary L. Erickson, Muskegon, Mich.

[73] Assignee: Cannon-Muskegon Corporation, Muskegon, Mich.

[21] Appl. No.: 905,462

[22] Filed: Jun. 29, 1992

[51] Int. Cl.[5] ............................................. C22C 19/05
[52] U.S. Cl. ...................................... 420/448; 420/443; 148/404; 148/410; 415/200; 416/241 R
[58] Field of Search ................... 148/404, 410, 428; 420/443, 448; 415/200; 416/241 R, 223 R

[56] References Cited

U.S. PATENT DOCUMENTS

| | | | |
|---|---|---|---|
| Re. 29,920 | 2/1979 | Baldwin | 420/448 |
| 3,765,879 | 10/1973 | Hockin et al. | 420/448 |
| 4,045,255 | 8/1977 | Jackson | 148/404 |
| 4,055,447 | 10/1977 | Jackson | 148/404 |
| 4,116,723 | 9/1978 | Gell et al. | 148/410 |
| 4,169,742 | 10/1979 | Wukusick et al. | 148/410 |
| 4,209,348 | 6/1980 | Duhl et al. | 148/410 |
| 4,222,794 | 9/1980 | Schweizer et al. | 148/410 |
| 4,292,076 | 9/1981 | Gigliotti et al. | 148/410 |
| 4,371,404 | 2/1983 | Duhl et al. | 148/409 |
| 4,402,772 | 9/1983 | Duhl et al. | 148/410 |
| 4,492,672 | 1/1985 | Duhl et al. | 420/448 |
| 4,643,782 | 2/1987 | Harris et al. | 148/404 |
| 4,677,035 | 6/1987 | Fiedler et al. | 148/404 |
| 4,719,080 | 1/1988 | Duhl et al. | 148/404 |
| 4,801,513 | 1/1989 | Duhl et al. | 148/404 |
| 4,849,030 | 7/1989 | Darolia et al. | 148/404 |
| 4,888,069 | 12/1989 | Duhl et al. | 148/404 |
| 4,908,183 | 3/1990 | Chin et al. | 148/404 |
| 4,915,907 | 4/1990 | Shah et al. | 148/404 |
| 5,035,958 | 7/1991 | Jackson et al. | 420/448 |
| 5,043,138 | 8/1991 | Darolia et al. | 420/443 |
| 5,068,084 | 11/1991 | Cetel et al. | 420/443 |
| 5,100,484 | 3/1992 | Wukusick et al. | 148/410 |

FOREIGN PATENT DOCUMENTS

| | | | |
|---|---|---|---|
| 2029539 | 11/1990 | Canada . | |
| 240451 | 10/1987 | European Pat. Off. | 148/404 |
| 2234521 | 2/1991 | United Kingdom . | |
| 2235697 | 3/1991 | United Kingdom . | |

OTHER PUBLICATIONS

H. J. Murphy; C. T. Sims and A. M. Beltran, "Phacomp Revisited" International Symposium on Structural Stability in Superalloys Sep. 1968.

*Primary Examiner*—Melvyn J. Andrews
*Assistant Examiner*—Margery S. Phipps
*Attorney, Agent, or Firm*—James D. Dee

[57] ABSTRACT

This invention relates to a nickel-based superalloy comprising the following elements in percent by weight: from about 5.0 to about 7.0 percent rhenium, from about 1.8 to about 4.0 percent chromium, from about 1.5 to about 9.0 percent cobalt, from about 7.0 to about 10.0 percent tantalum, from about 3.5 to about 7.5 percent tungsten, from about 5.0 to about 7.0 percent aluminum, from about 0.1 to about 1.2 percent titanium, from about 0 to about 0.5 percent columbium, from about 0.25 to about 2.0 percent molybdenum, from about 0 to about 0.15 percent hafnium, and the balance nickel+incidental impurities, the superalloy having a phasial stability number $N_{v3B}$ less than about 2.10.

32 Claims, 1 Drawing Sheet

SINGLE CRYSTAL NICKEL-BASED SUPERALLOY

BACKGROUND OF THE INVENTION

1. Field of the Invention

This invention relates to single crystal nickel-based superalloys and, more particularly, single crystal nickel-based superalloys and articles made therefrom for use in advanced gas turbine engines under high stress, high temperature conditions.

2. Description of the Prior Art

Advances over recent years in the metal temperature and stress capability of single crystal articles have been the result of the continuing development of single crystal superalloys, as well as improvements in casting processes and engine application technology. These single crystal superalloy articles include rotating and stationary turbine blades and vanes found in the hot sections of gas turbine engines. However, gas turbine engine design goals have remained the same during the past decades. These goals include the desire to increase engine operating temperature, rotational speed, thrust-to-weight ratio, fuel efficiency, and engine component durability and reliability.

The basic technology of alloys for the casting of single crystal components is described in U.S. Pat. Nos. 3,494,709; 4,116,723 and 4,209,348. Development work resulted in first generation nickel-based superalloys, which were materially improved over those described in the aforementioned patents. However, these first generation nickel-based superalloys contained no rhenium. Examples of such first generation nickel-based superalloys, commercially known as CMSX-2 alloy and CMSX-3 alloy produced by Cannon-Muskegon Corporation, assignee of the present application, are described in U.S. Pat. No. 4,582,548. Further development work resulted in second generation nickel-based superalloys having improved creep strength/creep rate. These second generation nickel-based superalloys have a moderate rhenium content of about 3 weight percent. An example of such a second generation nickel-based superalloy is described in U.S. Pat. No. 4,643,782. This patent discloses a superalloy, commercially known as CMSX-4 alloy, having a specific nickel-based composition including a rhenium content in the range of 2.8–3.2 weight percent. The present invention provides the next generation of nickel-based superalloys having higher total refractory element (W+Re+Mo+Ta) content and improved mechanical properties.

Single crystal articles are generally produced having the low-modulus (001) crystallographic orientation parallel to the component dendritic growth pattern or blade stacking fault axis. Face-centered cubic (FCC) superalloy single crystals grown in the (001) direction provide extremely good thermal fatigue resistance relative to conventionally cast articles. Since these single crystal articles have no grain boundaries, alloy design without grain boundary strengtheners, such as carbon, boron and zirconium, is possible. As these elements are alloy melting point depressants, their reduction from an alloy design provides a greater potential for high temperature mechanical strength achievement since more complete gamma prime solution and microstructural homogenization can be achieved relative to directionally solidified (DS) columnar grain and conventionally cast materials. Their reduction also makes possible a higher incipient melting temperature.

These process benefits are not necessarily realized unless a multi-faceted alloy design approach is undertaken. Alloys must be designed to avoid tendency for casting defect formation such as freckles, slivers, spurious grains and recrystallization. Additionally, the alloys must provide an adequate heat treatment window (numeric difference between an alloy's gamma prime solvus and incipient melting point) to allow for nearly complete gamma prime solutioning. At the same time, the alloy compositional balance should be designed to provide an adequate blend of engineering properties necessary for operation in gas turbine engines. Selected properties generally considered important by gas turbine engine designers include: elevated temperature creep-rupture strength, thermo-mechanical fatigue resistance, impact resistance plus hot corrosion and oxidation resistance.

An alloy designer can attempt to improve one or two of these design properties by adjusting the compositional balance of known superalloys. However, it is extremely difficult to improve more than one or two of the design properties without significantly or even severely compromising the remaining properties. The unique superalloy of the present invention provides an excellent blend of the properties necessary for use in producing single crystal articles for operation in gas turbine engine hot sections.

SUMMARY OF THE INVENTION

This invention relates to a nickel-based superalloy comprising the following elements in percent by weight: from about 5.0 to about 7.0 percent rhenium, from about 1.8 to about 4.0 percent chromium, from about 1.5 to about 9.0 percent cobalt, from about 7.0 to about 10.0 percent tantalum, from about 3.5 to about 7.5 percent tungsten, from about 5.0 to about 7.0 percent aluminum, from about 0.1 to about 1.2 percent titanium, from about 0 to about 0.5 percent columbium, from about 0.25 to about 2.0 percent molybdenum, from about 0 to about 0.15 percent hafnium, and the balance nickel plus incidental impurities, the superalloy having a phasial stability number $N_{v3B}$ less than about 2.10.

Advantageously, this superalloy composition may be further comprised of (percentages are in weight percent) from about 0 to about 0.04 percent carbon, from about 0 to about 0.01 percent boron, from about 0 to about 0.01 percent yttrium, from about 0 to about 0.01 percent cerium and from about 0 to about 0.01 percent lanthanum. Although incidental impurities should be kept to the least amount possible, the superalloy can also be comprised of from about 0 to about 0.04 percent manganese, from about 0 to about 0.05 percent silicon, from about 0 to about 0.01 percent zirconium, from about 0 to about 0.001 percent sulfur, and from about 0 to about 0.10 percent vanadium. In all cases, the base element is nickel. Furthermore, this superalloy can advantageously have a phasial stability number $N_{v3B}$ less than about 1.85, and a chromium content of from about 1.8 to about 3.0 percent, a rhenium content of from about 5.5 to about 6.5 percent, and a cobalt content of from about 2.0 to about 5.0 percent. This invention provides a superalloy having an increased resistance to creep under high stress, high temperature conditions, particularly up to about 1975° F.

Single crystal articles can be suitably made from the superalloy of this invention. The article can be a component for a turbine engine and, more particularly, the component can be a gas turbine blade or gas turbine vane.

The superalloy compositions of this invention have a critically balanced alloy chemistry which results in a unique blend of desirable properties. These properties include: excellent single crystal component castability, particularly for moderately sized blade and vane components; adequate cast component solutionability; excellent resistance to single crystal cast component recrystallization; ultra-high creep-rupture strength to about 1975° F.; extremely good low cycle fatigue strength; extremely good high cycle fatigue strength; high impact strength; very good bare hot corrosion resistance; very good bare oxidation resistance; and adequate microstructural stability, such as resistance to the undesirable, brittle phases called topologically close-packed (TCP) phases.

Accordingly, it is an object of the present to provide superalloy compositions and single crystal articles made therefrom having a unique blend of desirable properties. It is a further object of the present invention to provide superalloys and single crystal articles made therefrom for use in advanced gas turbine engines under high stress, high temperature conditions, such as up to about 1975° F. These and other objects and advantages of the present invention will be apparent to those skilled in the art upon reference to the following description of the preferred embodiments.

DESCRIPTION OF THE PREFERRED EMBODIMENTS

Figure 1:
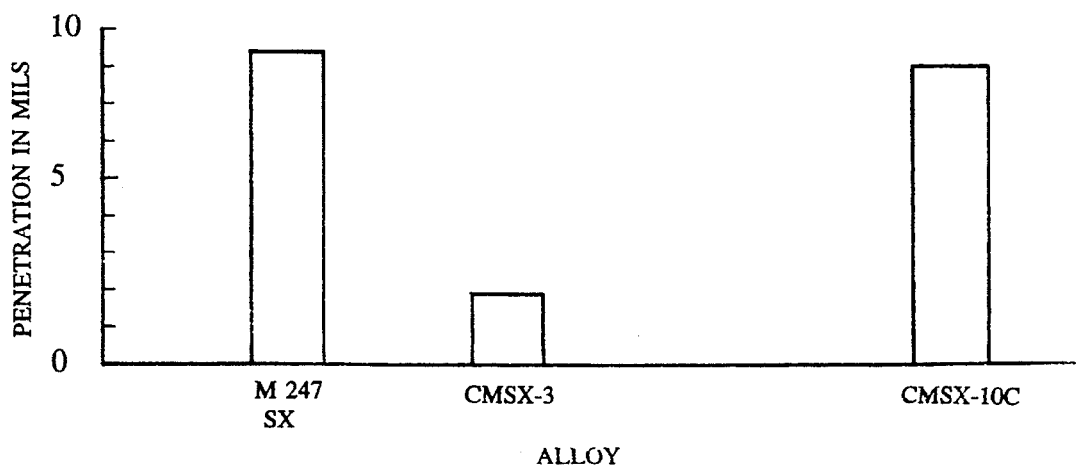
FIG. 1 is a chart of hot corrosion test results performed to 117 hours on one embodiment of the alloy of this invention and on two prior art alloys.

The nickel-based superalloy of the present invention comprises the following elements in percent by weight:

| | |
|---|---|
| Rhenium | about 5.0–7.0 |
| Chromium | about 1.8–4.0 |
| Cobalt | about 1.5–9.0 |
| Tantalum | about 7.0–10.0 |
| Tungsten | about 3.5–7.5 |
| Aluminum | about 5.0–7.0 |
| Titanium | about 0.1–1.2 |
| Columbium | about 0–0.5 |
| Molybdenum | about 0.25–2.0 |
| Hafnium | about 0–0.15 |
| Nickel + Incidental Impurities | balance |

This superalloy composition also has a phasial stability number $N_{v3B}$ less than about 2.10. Further, this invention has a critically balanced alloy chemistry which results in a unique blend of desirable properties. These properties include increased creep-rupture strength relative to prior art single crystal superalloys, single crystal component castability, cast component solutionability, single crystal component resistance to recrystallization, fatigue strength, impact strength, bare hot corrosion resistance, bare oxidation resistance, and microstructural stability, including resistance to TCP phase formation under high stress, high temperature conditions, Unlike prior nickel-based superalloys known in the art, the superalloys of the present invention have a low chromium, low cobalt and high rhenium content. The chromium is about 1.8–4.0% by weight. Advantageously, the chromium content is from 1.8% to 3.0% by weight. This chromium content is significantly lower than that typically found in prior art single crystal nickel-based superalloys. In the present superalloy, chromium provides hot corrosion resistance, although it may also assist with the alloy's oxidation capability. Tantalum and rhenium also assist toward hot corrosion property attainment, and aluminum is present at sufficient levels to provide adequate oxidation resistance, so that relatively low addition of chromium is tolerable in this alloy. Besides lowering the alloy's gamma prime solvus, chromium contributes to the formation of Cr, Re, W-rich TCP phase and must be balanced accordingly in these compositions.

The cobalt content is about 1.5–9.0% by weight. Advantageously, the cobalt content is from 2.0% to 5.0% by weight. This cobalt content is lower than that typically found in prior art single crystal nickel-based superalloys. In the present superalloy, cobalt assists in providing an appropriate heat treatment window since it has the effect of lowering the alloy's gamma prime solvus while generally not affecting its incipient melting point. Rhenium-containing alloys are generally designed with much higher cobalt content than the present invention for the purpose of imparting increased solid solubility and phasial stability. However, the superalloys of the present invention unexpectedly show that much lower cobalt contents are possible and desirable toward providing optimized phasial stability, including control of TCP phase formation.

The rhenium content is about 5.0–7.0% by weight and, advantageously, rhenium is present in an amount of from 5.5% to 6.5% by weight. The amount of rhenium in the superalloy of the present invention is significantly greater than the rhenium content of prior art single crystal nickel-based superalloys. Furthermore, the superalloys of this invention are generally designed with an increased level of refractory element content, e.g., W+Re+Mo+Ta. The tungsten content is about 3.5–7.5% by weight and, advantageously, the amount of tungsten is from 3.5% to 6.5% by weight. Tungsten is added since it is an effective solid solution strengthener and it contributes to strengthening the gamma prime. Additionally, tungsten is effective in raising the alloy's incipient melting temperature. The amount of tungsten added to these superalloys is balanced with the amount of rhenium added since they both contribute to, the formation of "freckle" defects during the single crystal investment casting process. They also both strongly effect the propensity for TCP phase formation.

Similar to tungsten, rhenium is effective in raising the alloy's incipient melting point. However, rhenium is a more effective strengthener than tungsten, molybdenum and tantalum in terms of elevated temperature creep-rupture and, therefore, rhenium is added appropriately. Additionally, rhenium has a positive influence on this alloy's hot corrosion resistance. Moreover, rhenium partitions primarily to the gamma matrix, and it is effective in slowing gamma prime particle growth during high temperature, high stress conditions. Besides requiring the balancing of rhenium with tungsten for castability reasons, W+Re must also be set at a level consistent with minimizing TCP phase formation. In general, the TCP phases which occur in such material are rich in chromium, tungsten, and rhenium content, with rhenium being present in the greatest proportion. Thus, careful Re/W ratio control is necessary in this alloy to control the propensity for TCP phase formation.

The molybdenum content is about 0.25–2.0% by weight. Advantageously, molybdenum is present in an amount of from 0.25% to 1.5% by weight. Molybdenum is a good solid solution strengthener, but it is not as effective as tungsten, rhenium and tantalum. However, since the alloy's density is always a design consideration, and the molybdenum atom is lighter than the other solid solution strengtheners, the addition of molybdenum is a means of assisting control of the overall alloy density in the compositions of this invention.

The tantalum content is about 7.0–10.0% by weight and, advantageously, the tantalum content is from 8.0% to 10.0% by weight. Tantalum is a significant contributor to this alloy's strength through means of solid solution strengthening and enhancement of gamma prime particle strength (tantalum also partitions to the gamma prime phase). In this alloy, tantalum is able to be utilized at relatively high concentration since it does not contribute to TCP phase formation. Additionally, tantalum is an attractive single crystal alloy additive in this composition since it assists in preventing "freckle" defect formation during the single crystal casting process. Tantalum is also beneficial in this composition since it tends to raise this alloy's gamma prime solvus, and it is effective toward promoting good alloy oxidation and hot corrosion resistance, along with aluminide coating durability.

The aluminum content is about 5.0–7.0% by weight. Furthermore, the amount of aluminum present in this composition is advantageously from 5.3% to 6.5% by weight. Aluminum and titanium are the primary elements comprising the gamma prime phase. These elements are added in this composition in a proportion and ratio consistent with achieving adequate alloy castability, solution heat treatability, phasial stability and high mechanical strength. Aluminum is also added to this alloy in proportions sufficient to provide oxidation resistance.

The titanium content is about 0.1–1.2% by weight. Advantageously, titanium is present in this composition in an amount from 0.2% to 0.8% by weight. Titanium is generally beneficial to the alloy's hot corrosion resistance, but it can have a negative effect to oxidation resistance, alloy castability and alloy response to solution heat treatment. Accordingly, the titanium content must be maintained within the stated range of this composition.

The columbium content is about 0–0.5% by weight and, advantageously, the columbium content is from 0 to 0.3% by weight. Columbium is a gamma prime forming element and it is an effective strengthener in the nickel-based superalloys of this invention. Generally, however, columbium is a detriment to alloy oxidation and hot corrosion properties, so its addition to the composition of this invention is minimized. Moreover, columbium is added to this invention's composition for the purpose of gettering carbon, which can be chemisorbed into component surfaces during non-optimized vacuum solution heat treatment procedures. Any carbon pick-up will tend to form columbium carbide instead of titanium or tantalum carbide, thereby preserving the greatest proportion of titanium and/or tantalum for gamma prime and/or solid solution strengthening in this alloy.

The hafnium content is about 0–0.15% by weight and, advantageously, hafnium is present in an amount from 0.02 to 0.05% by weight. Hafnium is added in a small proportion to the present composition in order to assist with coating adherence. Hafnium generally partitions to the gamma prime phase.

The balance of this invention's superalloy composition is comprised of nickel and small amounts of incidental impurities. Generally, these incidental impurities are entrained from the industrial process of production, and they should be kept to the least amount possible in the composition so that they do not affect the advantageous aspects of the superalloy. For example, these incidental impurities may include up to about 0.04% by weight manganese, up to about 0.05% by weight silicon, up to about 0.01% by weight zirconium, up to about 0.001% by weight sulfur, and up to about 0.10% by weight vanadium. Amounts of these impurities which exceed the stated amounts could have an adverse effect upon the resulting alloy's properties.

Additionally, the superalloy may optionally contain about 0–0.04% by weight carbon, about 0–0.01% by weight boron, about 0–0.01% by weight yttrium, about 0–0.01% by weight cerium and about 0–0.01% by weight lanthanum.

Not only does the superalloy of this invention have a composition within the above specified ranges, but it also has a phasial stability number $N_{v3B}$ less than about 2.10. Advantageously, the phasial stability number $N_{v3B}$ is less than 1.85 and, preferably, the phasial stability number $N_{v3B}$ is less than 1.75. As can be appreciated by those skilled in the art, $N_{v3B}$ is defined by the PWA N-35 method of nickel-based alloy electron vacancy TCP phase control factor calculation. This calculation is as follows:

EQUATION 1

Conversion for weight percent to atomic percent:

$$\text{Atomic percent of element } i = Pi = \frac{Wi/Ai}{\Sigma i(Wi/Ai)} \times 100$$

where: Wi=weight percent of element i
Ai=atomic weight of element i

EQUATION 2

Calculation for the amount of each element present in the continuous matrix phase:

| Element | Atomic amount Rii remaining |
|---|---|
| Cr | $R_{Cr} = 0.97 P_{Cr} - 0.375 P_B - 1.75 P_C$ |
| Ni | $R_{Ni} = P_{Ni} + 0.525 P_B - 3(P_{Al} + 0.03 P_{Cr} + P_{Ti} - 0.5 P_C + 0.5 P_V + P_{Ta} + P_{Cb} + P_{Hf})$ |
| Ti, Al, B, C, Ta, Cb, Hf | $R_{ii} = 0$ |
| V | $R_V = 0.5 P_V$ |
| W | $^*R_{(W)} = P_W - 0.167 P_C \frac{P_W}{P_{Mo} + P_W}$ |
| Mo | $R_{(Mo)} = P_{(Mo)} - 0.75 P_B - 0.167 P_C \frac{P_{Mo}}{(P_{Mo} + P_W)}$ |

*Note:
weight percentage Re is added to weight percentage W for the calculation above.

EQUATION 3

Calculation of $N_{v3B}$ using atomic factors from Equations 1 and 2 above:

$$N_i^j = \frac{R_i}{{}_iR_i} \quad \text{then} \quad N_{v3B} = \Sigma_i N_i(N_v)i$$

where: i=each individual element in turn.
$N_i$=the atomic factor of each element in matrix.
$(N_v)$ i=the electron vacancy No. of each respective element.

This calculation is exemplified in detail in a technical paper entitled "PHACOMP Revisited", by H. J. Murphy, C. T. Sims and A. M. Beltran, published in Volume 1 of International Symposium on Structural Stability in Superalloys (1968), the disclosure which is incorporated by reference herein. As can be appreciated by those skilled in the art, the phasial stability number for the superalloys of this invention is critical and must be less than the stated maximum to provide a stable microstructure and capability for the desired properties under high temperature, high stress conditions. The phasial stability number can be determined empirically, once the practitioner skilled in the art is in possession of the present subject matter.

The superalloy of this invention can be used to suitably make single crystal articles, such as components for turbine engines. Preferably, this superalloy is utilized to make a single crystal casting to be used under high stress, high temperature conditions characterized by an increased resistance to creep under such conditions, particularly high temperature conditions up to about 1975° F. While this superalloy can be used for any purpose requiring high strength castings incorporating a single crystal, its particular use is in the casting of single crystal blades and vanes for gas turbine engines. This alloy possesses an unusual resistance to component recrystallization during solution heat treatment, which is considered an important alloy characteristic that is necessary when producing advanced technology, multi-piece, cast bonded single crystal airfoils. Additionally, this superalloy provides the alloy castability characteristics believed necessary to produce conventional-process-cast, moderately-sized turbine airfoils with intricate cooling passages.

While this superalloy's primary use is in aircraft turbine engines, there are stationary engine applications requiring the specialized high performance characteristics of this alloy. This is particularly the case in turbine engines which require performing characteristics with very restricted clearances, thereby materially limiting the amount of permissible creep. Engines designed to develop high performance characteristics are normally operated at higher component temperatures and, therefore, the problem of creep is increased. Generally, creep in excess of 1% is considered unacceptable in these cases. The creep characteristics of known state of the art alloys have limited operating temperatures and, thus, maximum performance capability. The superalloy of this invention has an increased resistance to creep under high stress, high temperature conditions, particularly up to 1975° F.

The single crystal components made from this invention's compositions can be produced by any of the single crystal casting techniques known in the art. For example, single crystal directional solidification processes can be utilized, such as the seed crystal process and the choke process.

The single crystal castings made from the superalloy of the present invention are advantageously subjected to a high temperature aging heat treatment in order to optimize the creep-rupture properties of these alloys. This invention's single crystal castings can be aged at a temperature of from about 1950° F. to about 2125° F. for about 1 to about 20 hours. However, as can be appreciated by those skilled in the art, the optimum aging temperature and time for aging depends on the precise composition of the superalloy.

This invention provides superalloy compositions having a unique blend of desirable properties. These properties include: excellent single crystal component castability, particularly for moderately sized blade and vane components; excellent cast component solutionability; excellent resistance to single crystal cast component recrystallization ultra-high creep-rupture strength to about 1975° F.; extremely good low cycle fatigue strength; extremely good high cycle fatigue strength; high impact strength; very good bare hot corrosion resistance; very good bare oxidation resistance; and microstructural stability, such as resistance to formation of the undesirable TCP phases. As noted above, this superalloy has a precise composition with only small permissible variations in any one element if the unique blend of properties is to be maintained.

In order to more clearly illustrate this invention and provide a comparison with representative superalloys outside the claimed scope of the invention, the examples set forth below are presented. The following examples are included as being illustrations of the invention and its relation to other superalloys and articles, and should not be construed as limiting the scope thereof.

EXAMPLES

A large number of superalloy test materials were prepared to investigate the compositional variations and ranges for the superalloys of the present invention. Some of the alloy compositions tested and reported below fall outside the claimed scope of the present invention, but are included for comparative purposes to assist in the understanding of the invention. Representative alloy aim chemistries of those materials tested are reported in Table I below.

TABLE 1

| Alloy | | C | B | Cr | Co | Mo | W | Cb | Ti | Al | Ta | Re | Hf | Ni | Nv3B* | See "Key" Below | | | |
|---|---|---|---|---|---|---|---|---|---|---|---|---|---|---|---|---|---|---|---|
| | | | | | | | | | | | | | | | | 1 | 2 | 3 | 4 |
| CMSX | -10A | — | — | 3.0 | 8.5 | .70 | 7.2 | .30 | .65 | 6.0 | 7.6 | 5.0 | .05 | BAL | 2.08 | 12.46 | 6.65 | 14.55 | 20.76 |
| | -10B | — | — | 2.6 | 8.2 | .70 | 6.95 | .30 | .68 | 6.0 | 7.9 | 4.95 | .06 | BAL | 2.02 | 11.9 | 6.68 | 14.88 | 20.5 |
| | -10C | — | — | 2.5 | 7.7 | .70 | 6.6 | .30 | .65 | 5.9 | 8.2 | 4.8 | .05 | BAL | 1.90 | 11.4 | 6.55 | 15.05 | 20.3 |
| | -10D | — | — | 4.0 | 4.8 | .60 | 6.4 | .30 | .60 | 5.7 | 8.2 | 4.9 | .03 | BAL | 1.95 | 11.3 | 6.30 | 14.80 | 20.1 |
| | -10E | — | — | 2.2 | 7.2 | .70 | 6.3 | .25 | .72 | 5.85 | 8.3 | 4.8 | .042 | BAL | 1.84 | 11.1 | 6.57 | 15.12 | 20.1 |
| | -10F | .02 | .02 | 2.4 | 7.6 | .65 | 6.45 | .28 | .63 | 5.9 | 8.5 | 5.0 | .046 | BAL | 1.89 | 11.45 | 6.53 | 15.31 | 20.6 |
| | -10G | — | — | 2.4 | 6.3 | .50 | 6.4 | .20 | .70 | 5.8 | 8.0 | 5.5 | .04 | BAL | 1.82 | 11.9 | 6.5 | 14.7 | 20.4 |
| | -10Ga | — | — | 2.4 | 4.0 | .50 | 6.2 | .15 | .55 | 5.8 | 8.3 | 5.6 | .04 | BAL | 1.72 | 11.8 | 6.35 | 14.8 | 20.6 |
| 10K | -10Gb | — | — | 2.3 | 3.3 | .40 | 5.5 | .10 | .30 | 5.7 | 8.4 | 6.3 | .03 | BAL | 1.60 | 11.8 | 6.0 | 14.5 | 20.6 |

TABLE 1-continued

| Alloy | | C | B | Cr | Co | Mo | W | Cb | Ti | Al | Ta | Re | Hf | Ni | Nv3B* | See "Key" Below | | | |
|---|---|---|---|---|---|---|---|---|---|---|---|---|---|---|---|---|---|---|---|
| | | | | | | | | | | | | | | | | 1 | 2 | 3 | 4 |
| | -10H | — | — | 2.2 | 5.9 | .50 | 6.4 | .15 | .80 | 5.9 | 8.0 | 5.5 | .04 | BAL | 1.82 | 11.9 | 6.7 | 14.85 | 20.4 |
| | -10I | — | — | 2.5 | 4.7 | .50 | 6.4 | .15 | .70 | 5.8 | 7.9 | 6.0 | .04 | BAL | 1.81 | 12.4 | 6.5 | 14.65 | 20.9 |
| | -10Ia | — | — | 2.5 | 3.3 | .40 | 6.1 | .10 | .60 | 5.8 | 7.9 | 6.0 | .04 | BAL | 1.69 | 12.1 | 6.4 | 14.4 | 20.4 |
| | -10J | .015 | .01 | 2.65 | 4.0 | .50 | 6.0 | .20 | .65 | 5.8 | 9.0 | 5.5 | .04 | BAL | 1.79 | 11.5 | 6.45 | 15.65 | 21.0 |
| | -10L | — | — | 2.0 | 2.7 | .40 | 5.3 | .10 | .20 | 5.65 | 8.4 | 6.3 | .03 | BAL | 1.50 | 11.6 | 5.85 | 14.35 | 20.4 |
| CMSX | -12A | — | — | 3.0 | 4.5 | .35 | 5.5 | — | 1.0 | 5.65 | 9.0 | 5.5 | .04 | BAL | 1.84 | 11.0 | 6.65 | 15.65 | 20.35 |
| | -12B | — | — | 3.5 | 3.0 | .35 | 5.0 | — | .90 | 5.60 | 8.8 | 6.0 | .04 | BAL | 1.80 | 11.0 | 6.5 | 15.3 | 20.15 |
| | -12C | — | — | 2.8 | 3.5 | .40 | 5.3 | — | .75 | 5.60 | 8.8 | 5.8 | .04 | BAL | 1.70 | 11.1 | 6.35 | 15.15 | 20.3 |
| 12D | -12Ca | — | — | 2.5 | 3.2 | .45 | 4.7 | — | .50 | 5.60 | 8.7 | 6.3 | .03 | BAL | 1.61 | 11.0 | 6.10 | 14.8 | 20.15 |
| | -12E | — | — | 2.0 | 3.0 | .45 | 4.7 | — | .40 | 5.60 | 8.7 | 6.3 | .03 | BAL | 1.50 | 11.0 | 6.0 | 14.7 | 20.15 |
| CMSX | -10Ri | — | — | 2.65 | 7.0 | .60 | 6.4 | .40 | .80 | 5.8 | 7.5 | 5.5 | .06 | BAL | 1.91 | 11.9 | 6.6 | 14.5 | 20.0 |
| CMSX | -12Ri | — | — | 3.4 | 8.0 | .50 | 6.0 | — | 1.0 | 5.6 | 7.6 | 5.3 | .06 | BAL | 1.92 | 11.3 | 6.6 | 14.6 | 19.4 |

Key:
1-W + Re
2-Al + Ti
3-Al + Ti + Ta + Cb
4-W + Re + Mo + Ta
*Calculated using PWA N-35 Method Third generation single crystal alloy development to investigate the compositional variations for the superalloys of the present invention began with the definition and evaluation of a series of experimental compositions. Increased creep-rupture strength was the primary objective of the initial development effort, with elemental balancing to provide a combination of useful engineering characteristics following the definition of a base concept for increased strength.

The initial materials explored the utility of higher levels of refractory element and gamma prime forming elements than are present in similar prior art compositions. As shown in Table 1, the alloy chromium content was reduced to improve alloy stability. Cobalt content, initially thought to be required for increased solid solubility, could be significantly reduced. Refractory element content (W+Re+Mo+Ta) was varied, while the summation of the primary gamma prime partitioning elements (Ai+Ti+Ta+Cb) was also varied. The alloy's Re content was initially explored at conventional levels, but it was found that the Re level had to be increased.

Standard $N_{v3B}$ calculations were performed during the initial alloy design stage to assist respective alloy phasial stability predictions, with that number varying from one alloy composition to another.

Some of the alloys were produced using production-type procedures. These alloys were vacuum induction melted in the Cannon-Muskegon Corporation V-1 furnace, yielding approximately 200–300 lbs, of bar product per alloy (see Table 2 below). Quantities of each compositional iteration, as reported in Table 2, were made into test bars and test blades by vacuum investment casting. Solution heat treatment procedures were developed in the laboratory in 3" and 6" diameter tube furnaces. Gamma prime aging treatments were also performed in the laboratory.

TABLE 2

| | | V-1 VIM FURNACE HEAT CHEMISTRIES | | | | | | | | | | | | |
|---|---|---|---|---|---|---|---|---|---|---|---|---|---|---|
| Alloy | | Heat No. | C | B | Cr | Co | Mo | W | Cb | Ti | Al | Ta | Re | Nf | Ni |
| CMSX | -10A | VF 778 | .001 | <.001 | 2.9 | 8.5 | .7 | 7.2 | .3 | .70 | 6.05 | 7.6 | 5.0 | .05 | BASE |
| | -10B | VF 831 | .002 | <.001 | 2.6 | 8.2 | .7 | 6.9 | .3 | .68 | 6.06 | 7.9 | 4.9 | .05 | BASE |
| | -10Ri | VF 965 | .001 | <.001 | 2.65 | 7.0 | .6 | 6.4 | .4 | .80 | 5.72 | 7.6 | 5.5 | .06 | BASE |
| | -10Ri | VF 966 | .001 | <.001 | 2.69 | 7.0 | .6 | 6.3 | .4 | .80 | 5.66 | 7.6 | 5.4 | .06 | BASE |
| | -10Ri | VF 980 | .001 | <.001 | 2.66 | 7.0 | .6 | 6.3 | .4 | .79 | 5.78 | 7.6 | 5.4 | .06 | BASE |
| | -12Ri | VF 963 | .001 | <.001 | 3.3 | 8.0 | .48 | 6.0 | <.05 | 1.01 | 5.69 | 7.6 | 5.3 | .07 | BASE |
| | -12Ri | VF 964 | .001 | <.001 | 3.4 | 8.0 | .48 | 6.1 | <.05 | 1.00 | 5.60 | 7.6 | 5.3 | .06 | BASE |
| | -12Ri | VF 979 | .001 | <.001 | 3.4 | 8.0 | .50 | 6.1 | <.05 | 1.00 | 5.56 | 7.6 | 5.3 | .06 | BASE |
| | -10Ga | VF 983 | .001 | <.001 | 2.4 | 3.95 | .41 | 6.1 | .14 | .56 | 5.83 | 8.4 | 5.9 | .03 | BASE |
| | -12C | VF 985 | .001 | <.001 | 2.7 | 3.5 | .45 | 5.3 | <.05 | .75 | 5.66 | 8.8 | 6.0 | .025 | BASE |
| | -10Gb (-10K) | VF 994 | .001 | <.001 | 2.2 | 3.3 | .40 | 5.5 | .09 | .24 | 5.74 | 8.2 | 6.4 | .025 | BASE |
| | -12Ca (-12D) | VF 993 | .001 | <.001 | 2.4 | 3.2 | .46 | 4.8 | <.01 | .50 | 5.64 | 8.6 | 6.4 | .025 | BASE |

All other specimens reported in Table 1 above were produced by blending base alloy bar stock with the virgin elemental additions necessary to achieve the desired composition. The blending was done during test bar and blade manufacture. The base alloy bar stock plus virgin additions were placed into the casting furnace melt crucible, melted and the bath homogenized prior to pouring into an appropriate shell mold. It is believed that good correlation between alloy aim chemistry and test bar/blade chemistry was routinely achieved (see Table 3 below).

TABLE 3

| Alloy | | C | B | Cr | Co | Mo | W | Cb | Ti | Al | Ta | Re | Hf | Ni | Nv3B* |
|---|---|---|---|---|---|---|---|---|---|---|---|---|---|---|---|
| CMSX | -10A | — | — | 2.9 | 8.5 | .68 | 7.4 | .29 | .69 | 6.0 | 7.5 | 5.1 | .07 | BAL | 2.09 |
| | -10B | — | — | 2.7 | 8.1 | .69 | 6.95 | .29 | .69 | 6.0 | 7.8 | 4.8 | .06 | BAL | 2.01 |
| | -10C | — | — | 2.6 | 7.7 | .69 | 6.4 | .30 | .62 | 5.7 | 8.3 | 4.7 | .07 | BAL | 1.86 |
| | -10D | — | — | 4.0 | 5.0 | .62 | 6.0 | .31 | .59 | 5.44 | 8.1 | 4.7 | .04 | BAL | 1.83 |
| | -10E | — | — | 2.2 | 7.2 | .70 | 6.4 | .26 | .63 | 5.89 | 8.2 | 4.8 | .05 | BAL | 1.84 |
| | -10F | .014 | .027 | 2.4 | 7.7 | .65 | 6.4 | .28 | .63 | 5.96 | 7.9 | 5.0 | .04 | BAL | 1.86 |
| | -10G | — | — | 2.5 | 6.5 | .53 | 5.5 | .20 | .68 | 5.6 | 8.2 | 4.6 | .05 | BAL | 1.68 |
| | -10Ga | — | — | 2.4 | 4.0 | .41 | 6.2 | .14 | .55 | 5.79 | 8.3 | 6.0 | .025 | BAL | 1.73 |

TABLE 3-continued

| Alloy | C | B | Cr | Co | Mo | W | Cb | Ti | Al | Ta | Re | Hf | Ni | Nv3B* |
|---|---|---|---|---|---|---|---|---|---|---|---|---|---|---|
| -10Gb (10K) | — | — | 2.3 | 3.5 | .42 | 5.9 | .10 | .43 | 5.67 | 8.5 | 6.0 | .024 | BAL | 1.63 |
| -10H | — | — | 2.3 | 5.6 | .51 | 6.2 | .17 | .76 | 5.58 | 7.8 | 5.4 | .05 | BAL | 1.69 |
| -10I | — | — | 2.6 | 4.8 | .52 | 6.6 | .14 | .67 | 5.65 | 7.4 | 5.4 | .04 | BAL | 1.70 |
| -10Ia | — | — | 2.7 | 3.5 | .47 | 5.2 | .10 | .60 | 5.80 | 8.0 | 5.8 | .04 | BAL | 1.67 |
| -10J | .017 | .01 | 2.6 | 4.0 | .48 | 6.0 | .19 | .62 | 5.74 | 8.8 | 5.7 | .04 | BAL | 1.76 |
| -10L | — | — | | | | | | | | | | | | |
| -12A | — | — | 3.0 | 4.6 | .39 | 5.3 | <.01 | .96 | 5.61 | 9.4 | 5.0 | .05 | BAL | 1.80 |
| -12B | — | — | 3.5 | 3.0 | .38 | 5.1 | <.01 | .84 | 5.52 | 8.8 | 6.1 | .05 | BAL | 1.79 |
| -12C | — | — | 2.7 | 3.5 | .45 | 5.4 | <.01 | .75 | 5.62 | 8.8 | 6.0 | .04 | BAL | 1.72 |
| -12Ca (12D) | — | — | 2.5 | 3.2 | .46 | 5.0 | <.01 | .61 | 5.56 | 8.7 | 6.0 | .03 | BAL | 1.60 |
| -12E | — | — | | | | | | | | | | | | |
| -10Ri | — | — | 2.65 | 7.0 | .60 | 6.4 | .40 | .80 | 5.67 | 7.6 | 5.5 | .065 | BAL | 1.87 |
| 12Ri | — | — | 3.4 | 8.0 | .48 | 6.1 | <.01 | .99 | 5.54 | 7.6 | 5.3 | .07 | BAL | 1.92 |

*PWA N-35 Method

For the CMSX-10D specimen (see Table 1), high quality virgin elemental additions were vacuum melted and the refined material was poured into 2" diameter bars. In turn, a quantity of the resulting bar was used to produce single crystal test bar/blade specimens by investment casting.

It was apparent that considerable variation in the investment casting process integrity may have occurred during specimen manufacture since varying levels of test bar freckle formation, secondary dendrite arm spacing and property attainment were apparent. Derivative alloy response to solution treatment (reported in Table 4 below) varied, and was a function of both alloy composition and test specimen quality.

Heat treatments developed for the alloy iterations are reported in Table 4 below. Full gamma prime solutioning was desired for each material, however, this objective was not universally achieved. Primary gamma prime aging was performed to effect a more desirable gamma prime particle size and distribution. Secondary gamma prime aging was performed to effect precipitation of conventional matrix gamma prime precipitates along with ultra-fine gamma prime precipitates located within the matrix channels between the primary gamma prime particles for these specimens.

TABLE 4

| | | Heat Treatment Detail | | | |
|---|---|---|---|---|---|
| | | Peak Solution Temperature | | % γ, | Primary γ, | Secondary γ, |
| Alloy | | °F. | °C. | Solutioned* | Aging+ | Aging+ |
| CMSX -10A | 2460 | 1349 | 97.0–98.0 | 1975° F./4 Hrs | 1600° F./20 + 1400° F./24 |
| -10B | 2465 | 1352 | 97.0–98.0 | 1975° F./4 Hrs 1975° F./19.5 Hrs | 1600° F./20 + 1400° F./24 |
| -10C | 2470 | 1354 | 99.0–99.5 | 2100° F./8 Hrs 1975° F./10 Hrs | 1600° F./20 + 1400° F./24 |
| -10D | 2450 | 1343 | 99.9–100 | 1975° F./10 Hrs | 1600° F./22 + 1400° F./24 |
| -10E | 2465 | 1352 | 100 | 1975° F./15 Hrs 1975° F./21 Hrs | 1600° F./20 + 1400° F./24 1600° F./25.5 + 1400° F./23 |
| -10F | 2444 | 1340 | 95 | 1975° F./16 Hrs | 1600° F./23 + 1400° F./24 |
| -10G | 2475 | 1357 | 99.0–99.5 | 1975° F./12 Hrs | 1600° F./24.5 + 1400° F./17 |
| -10Ga | 2485–90 | 1363–65 | 99.5–100 | 2075° F./5 Hrs 2075° F./6 Hrs | 1600° F./20 + 1400° F./23 1600° F./24 + 1400° F./30 1612° F./48 + 1414° F./22 |
| -10Gb(10K) | 2485 | 1363 | 100 | 2075° F./6 Hrs | 1600° F./24 + 1400° F./30 |
| -10H | 2475 | 1357 | 98.5–99.0 | 1975° F./16 Hrs 1975° F./18 Hrs | 1600° F./27.5 + 1400° F./27 1600° F./101 + 1400° F./46 |
| -10I | 2475 | 1357 | 100 | 2075° F./5 Hrs | 1600° F./22 + 1405° F./24 |
| -10Ia | 2480 | 1360 | 99.5–100 | 2075° F./5 Hrs | 1600° F./24 + 1400° F./24 |
| -10J | 2480 | 1360 | 98.0–99.0 | 1975° F./15 Hrs 2075° F./5 Hrs | 1600° F./24 + 1400° F./30 1600° F./24 + 1400° F./30 |
| -10L | | | | | |
| -12A | 2475 | 1357 | 98.5–99.0 | 1975° F./16.5 Hrs 1975° F./12 Hrs | 1600° F./24 + 1400° F./32 1600° F./24 + 1400° F./27.5 |
| -12B | 2480 | 1360 | 99.0–99.5 | 1975° F./13 Hrs | 1600° F./57 + 1400° F./39 |
| -12C | 2485–90 | 1363–65 | 99.5–100 | 2075° F./5 Hrs 2075° F./6 Hrs | 1600° F./20 + 1400° F./5 1600° F./24 + 1400° F./30 |
| -12Ca(12D) | 2485 | 1363 | 100 | 2075° F./6 Hrs | 1600° F./24 + 1400° F./30 |
| -12E | | | | | |
| -10Ri | 2460 | 1349 | 98.5–99.8 | 2075° F./6 Hrs | 1600° F./24 + 1400° F./30 |
| -12Ri | 2455 | 1346 | 100 | 2075° F./6 Hrs | 1600° F./24 + 1400° F./30 |

*Determined by visual estimation
+Specimens air cooled from all aging treatments Fully heat treated test bars were creep-rupture tested. The specimens were machined and low-stress ground to ASTM standard proportional specimen dimension. The specimens were creep-rupture tested at various condition of temperature and stress, according to standard ASTM procedure.

A significant factor of the CMSX-10A alloy design was the shift to higher Re content. At the same time, W, Cr, Ta and other gamma prime strengtheners were balanced to provide the desired alloy characteristics and properties. The alloys higher Re level resulted in significantly improved creep-rupture strength throughout the entire test regime, as indicated by the results reported in Table 5 below for the CMSX-10A specimens.

Cr content and similar reduction to Co and W+Re level. W was reduced more than the Re in this specimen

TABLE 5

| | CMSX-10A CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| 1600° F./75.0 ksi | 534.4 | 24.2 | 26.9 | 534.2 | 22.331 | 10.9 | 21.0 |
| | 328.4 | 22.0 | 27.8 | 328.3 | 21.055 | 6.3 | 8.7 |
| | 527.3 | 21.1 | 26.3 | 526.3 | 17.552 | 28.4 | 72.2 |
| 1700° F./50.0 ksi | 305.0 | 31.1 | 34.5 | 304.2 | 28.614 | 62.1 | 108.9 |
| | 292.4 | 19.2 | 19.9 | 291.8 | 19.324 | 71.5 | 123.7 |
| | 87.6 | 2.6 | 5.8 | 85.7 | 1.474 | 65.9 | — |
| 1800° F./30.0 ksi | 415.6 | 16.1 | 21.4 | 413.8 | 15.643 | 182.7 | 246.1 |
| | 848.0 | 37.1 | 33.0 | 846.3 | 34.326 | 460.4 | 524.3 |
| | 1016.2 | 33.2 | 30.5 | 1014.3 | 32.984 | 476.8 | 655.1 |
| 1800° F./36.0 ksi | 586.5 | 38.1 | 38.0 | 585.6 | 33.050 | 395.0 | 425.0 |
| | 572.7 | 36.9 | 35.3 | 570.7 | 29.029 | 395.0 | 422.0 |
| | 546.5 | 26.4 | 34.2 | 545.7 | 25.843 | 373.0 | 406.0 |
| | 420.3 | 22.4 | 26.3 | 418.7 | 18.105 | 286.7 | 317.6 |
| | 426.0 | 14.8 | 17.0 | 425.1 | 10.244 | 326.5 | 353.2 |
| | 239.8 | 24.3 | 23.8 | 239.7 | 23.264 | 94.1 | 123.9 |
| | 255.7 | 19.9 | 27.4 | 253.6 | 18.510 | 115.2 | 152.7 |
| 1900° F./25.0 ksi | 32.3 | 5.5 | 11.0 | 31.0 | 2.075 | 26.7 | 30.7 |
| | 129.7 | 43.2 | 38.9 | 128.7 | 39.556 | 30.4 | 48.1 |
| | 168.7 | 34.7 | 36.4 | 166.1 | 30.816 | 58.2 | 78.4 |
| | 228.1 | 18.1 | 32.3 | 226.4 | 16.926 | 146.3 | 160.6 |
| | 277.7 | 29.5 | 31.1 | 276.4 | 27.323 | 9.9 | 29.9 |
| | 423.4 | 39.7 | 38.3 | 422.7 | 35.121 | 218.4 | 250.9 |
| | 383.8 | 35.9 | 36.1 | 382.7 | 34.861 | 192.9 | 226.7 |
| | 373.3 | 31.3 | 35.7 | 371.6 | 26.138 | 211.6 | 238.0 |
| 2000° F./18.0 ksi | 138.0 | 22.3 | 33.0 | 136.3 | 19.052 | 33.9 | 77.0 |
| | 134.9 | 40.7 | 36.5 | 134.7 | 38.328 | 54.7 | 71.9 |
| | 122.9 | 23.2 | 34.9 | 122.0 | 19.050 | 50.1 | 69.4 |
| | 115.6 | 34.2 | 36.6 | 114.4 | 30.861 | 40.8 | 56.8 |
| | 245.2 | 35.1 | 36.2 | 244.3 | 29.844 | 135.7 | 157.9 |
| | 221.9 | 36.3 | 35.4 | 221.8 | 33.737 | 113.0 | 140.0 |
| | 181.2 | 32.1 | 34.2 | 180.1 | 29.249 | 53.1 | 61.4 |
| 2050° F./15.0 ksi | 126.4 | 47.9 | 49.0 | 124.1 | 30.086 | 45.8 | 69.8 |
| | 150.5 | 45.5 | 47.8 | 148.1 | 39.308 | 16.8 | 34.5 |
| | 140.5 | 30.6 | 40.0 | 138.7 | 23.596 | 30.6 | 76.4 |
| | 120.8 | 29.5 | 39.7 | 120.0 | 29.479 | 16.3 | 55.6 |
| | 79.0 | 11.7 | 14.4 | 79.0 | 11.644 | 41.7 | 54.8 |
| | 112.2 | 24.3 | 31.3 | 112.1 | 21.401 | 55.9 | 69.5 |
| 2100° F./12.5 ksi | 94.1 | 22.1 | 27.5 | 94.1 | 20.520 | 42.2 | 62.6 |
| | 112.5 | 39.4 | 33.1 | 112.2 | 29.126 | 28.0 | 58.8 |
| | 96.6 | 25.9 | 35.9 | 95.5 | 14.542 | 52.3 | 62.5 |
| | 123.6 | 43.4 | 40.4 | 122.9 | 31.050 | 40.9 | 63.5 |
| | 50.8 | 21.7 | 29.6 | 49.9 | 9.330 | 35.1 | 37.6 |
| | 90.5 | 41.6 | 43.7 | 89.7 | 37.422 | 13.6 | 38.5 |
| 1800° F./36.0 ksi* | 420.6 | 23.9 | 35.1 | 419.9 | 23.196 | 213.8 | 286.0 |
| | 396.1 | 37.1 | 34.0 | 394.7 | 31.623 | 239.4 | 264.9 |
| | 384.9 | 31.1 | 34.0 | 382.9 | 25.554 | 220.5 | 247.9 |

*As-Solutioned Condition

Microstructural review of the failed rupture specimens of this alloy revealed that TCP phase precipitation occurred during the respective creep-rupture tests, particularly those at 1900° F. and above. It became apparent that the $N_{v3B}$ phasial stability number calculation would be an effective tool in predicting alloy stability and, effectively, high temperature creep strength for the invention.

Wherein the CMSX-10A specimen's $N_{v3B}$ number was 2.08, CMSX-10B was designed to the 2.02 level. This was accomplished by the further reduction of alloy since Re is more effective in the solid solution. Additionally, wherein some loss in W contribution to the gamma prime could be anticipated, it was sufficiently replaced by the modest increase to Ta content in this composition. These changes resulted in the CMSX-10B alloy specimen exhibiting even more improved creep strength at 1800° F. Table 6 reported below illustrates that three specimens achieved an average life of 961 hours, with 1.0% creep occurring at an average of 724 hours. However, it was observed that TCP phase was present at higher temperature.

TABLE 6

| | CMSX-10B CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| 1800° F./36.0 ksi | 907.1 | 19.2 | 34.0 | 907.0 | 17.832 | 697.2 | 752.7 |
| | 989.3 | 18.9 | 33.5 | 988.5 | 17.657 | 768.1 | 817.8 |
| | 988.4 | 35.9 | 36.1 | 987.3 | 31.813 | 705.8 | 767.5 |
| | 507.0 | 44.1 | 45.4 | 505.7 | 41.548 | 317.9 | 352.6 |
| | 598.1 | 46.9 | 43.4 | 596.1 | 42.340 | 386.5 | 415.2 |

TABLE 6-continued

CMSX-10B CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| | 408.3 | 62.6 | 52.1 | 407.2 | 54.479 | 187.3 | 256.5 |
| | 265.3 | 39.7 | 43.7 | 262.7 | 37.102 | 87.6 | 119.2 |
| | 385.3 | 45.5 | 46.2 | 383.5 | 39.031 | 177.4 | 213.4 |
| | 412.8 | 43.4 | 40.5 | 410.6 | 38.771 | 189.1 | 233.4 |
| | 389.3 | 51.5 | 44.2 | 386.8 | 36.920 | 220.5 | 249.2 |
| | 459.5 | 40.0 | 46.3 | 458.0 | 39.513 | 210.2 | 291.1 |
| | 258.0 | 38.1 | 40.6 | 257.9 | 36.743 | 32.1 | 90.2 |
| | 484.1 | 27.9 | 40.0 | 483.4 | 26.296 | 288.1 | 326.7 |
| | 376.9 | 16.4 | 20.4 | 376.8 | 16.088 | 96.0 | 226.6 |
| | 481.0 | 50.5 | 48.2 | 478.8 | 34.557 | 264.4 | 297.5 |
| | 461.5 | 35.1 | 40.6 | 460.1 | 30.786 | 181.1 | 265.3 |
| | 483.0 | 47.1 | 46.8 | 482.1 | 43.714 | 286.2 | 320.7 |
| | 500.1 | 33.4 | 37.0 | 499.7 | 30.486 | 11.9 | 280.1 |
| 1800° F./40 ksi | 436.7 | 40.2 | 44.1 | 436.2 | 39.818 | 294.6 | 318.9 |
| | 390.8 | 50.1 | 42.8 | 390.3 | 41.817 | 250.9 | 276.2 |
| | 336.9 | 52.7 | 48.1 | 335.2 | 46.697 | 226.5 | 240.9 |
| 1900° F./25.0 ksi | 237.8 | 55.9 | 45.7 | 237.4 | 53.854 | 33.0 | 113.5 |
| | 295.7 | 57.4 | 49.1 | 295.6 | 46.592 | 123.7 | 170.9 |
| 2000° F./18.0 ksi | 192.7 | 31.5 | 26.6 | 191.6 | 27.733 | 56.3 | 88.6 |
| | 166.5 | 41.4 | 25.3 | 166.5 | 34.102 | 46.2 | 72.7 |
| | 173.3 | 36.6 | 27.0 | 171.4 | 31.481 | 24.0 | 66.1 |
| 2050° F./15.0 ksi | 219.6 | 40.1 | 40.4 | 218.6 | 37.871 | 13.2 | 56.8 |
| | 122.3 | 28.2 | 47.9 | 120.6 | 26.614 | 37.0 | 63.7 |
| | 118.4 | 33.2 | 60.0 | 116.9 | 29.986 | 36.7 | 56.5 |
| | 179.7 | 44.1 | 48.1 | 179.1 | 39.188 | 8.4 | 75.3 |
| | 74.9 | 44.2 | 48.6 | 74.6 | 34.800 | 6.8 | 14.5 |
| | 168.3 | 48.6 | 49.7 | 167.0 | 43.171 | 36.9 | 77.1 |
| | 104.8 | 17.0 | 27.2 | 102.8 | 1.626 | 66.1 | — |
| | 155.9 | 46.3 | 49.8 | 155.2 | 38.388 | 64.4 | 81.9 |
| | 90.6 | 15.1 | 21.4 | 87.1 | 1.046 | 75.5 | — |
| | 120.5 | 46.3 | 55.8 | 118.7 | 35.143 | 10.3 | 27.7 |
| | 150.7 | 39.8 | 49.7 | 150.1 | 33.903 | 21.4 | 60.9 |
| | 149.5 | 33.2 | 46.2 | 148.9 | 23.166 | 73.3 | 88.3 |
| | 142.9 | 42.0 | 47.5 | 142.5 | 41.524 | 54.9 | 70.5 |
| 2050° F./15.0 ksi | 163.0 | 52.5 | 49.2 | 161.9 | 46.146 | 20.5 | 76.9 |
| | 151.1 | 66.4 | 45.6 | 150.7 | 59.115 | 52.7 | 75.5 |
| | 131.8 | 57.3 | 44.4 | 131.5 | 48.310 | 26.3 | 57.1 |
| | *156.0 | 54.4 | 41.0 | 155.9 | 45.502 | 55.5 | 78.3 |
| | *133.7 | 57.2 | 56.0 | 132.7 | 41.753 | 67.5 | 80.7 |
| | *135.1 | 59.7 | 52.3 | 134.3 | 46.317 | 54.9 | 71.5 |
| | 151.1 | 66.4 | 45.6 | 150.7 | 59.115 | 52.7 | 75.5 |
| | 131.8 | 57.3 | 44.4 | 131.5 | 48.310 | 26.3 | 57.1 |
| 2100° F./15.0 ksi | 69.7 | 54.2 | 48.1 | 69.4 | 47.674 | 25.3 | 36.3 |

*As-Solutioned Condition

Only about 97–98% gamma prime solutioning was achieved in the CMSX-10A and -10B materials (see Table 4) which was insufficient for the purpose of optimizing alloy mechanical properties and microstructural homogeneity. Attainment of a greater level of gamma prime solutioning, therefore, became an equal priority in tandem with improving microstructural stability at temperatures above 1900° F.

To confirm the suspected composition of the TCP phase forming in the alloys, scanning electron microscope (SEM) wavelength dispersive x-ray (WDX) microchemistry analyses of CMSX-10B test bar contained needles was undertaken and compared to the alloys gamma and gamma prime compositions. The results, reported in Table 7 below, confirm that the needles were enriched in Cr, W and Re.

TABLE 7

CMSX-10B Micro-Chemistry Analyses
Cast Test Bar (VF 831)
Transverse Section. Bottom Bar Location.
Solutioned to 2465° F.
Aged   1975° F./19.5 Hrs./AC
          1600° F./20 Hrs./AC
          1400° F./24 Hrs./AC

| ELEM | GAMMA PHASE | | | | GAMMA PRIME PHASE | | | | NEEDLE CONSTITUENT | | | |
|---|---|---|---|---|---|---|---|---|---|---|---|---|
| | K | Z | A | F | K | Z | A | F | K | Z | A | F |
| ALK | 0.0101 | 1.090 | 0.324 | 1.000 | 0.0145 | 1.084 | 0.322 | 1.000 | 0.0116 | 1.107 | 0.347 | 1.000 |
| TIK | 0.0069 | 1.007 | 0.930 | 1.051 | 0.0084 | 1.002 | 0.934 | 1.052 | 0.0077 | 1.026 | 0.908 | 1.039 |
| CRK | 0.0428 | 1.008 | 0.963 | 1.108 | 0.0250 | 1.002 | 0.965 | 1.117 | 0.0390 | 1.028 | 0.949 | 1.083 |
| COK | 0.0970 | 0.994 | 0.984 | 1.018 | 0.0761 | 0.988 | 0.987 | 1.022 | 0.0755 | 1.016 | 0.977 | 1.025 |
| NIK | 0.6891 | 1.033 | 0.988 | 1.010 | 0.7270 | 1.026 | 0.991 | 1.005 | 0.6143 | 1.056 | 0.983 | 1.024 |
| TAL | 0.0485 | 0.794 | 1.020 | 1.000 | 0.0697 | 0.788 | 1.024 | 1.000 | 0.0389 | 0.814 | 1.018 | 1.000 |
| W L | 0.0329 | 0.788 | 0.963 | 1.000 | 0.0311 | 0.783 | 0.962 | 1.000 | 0.0682 | 0.808 | 0.968 | 1.000 |

TABLE 7-continued

| | | | | | | | | | | | |
|---|---|---|---|---|---|---|---|---|---|---|---|
| REL | 0.0422 | 0.785 | 0.968 | 1.000 | 0.0085 | 0.779 | 0.968 | 1.000 | 0.1083 | 0.805 | 0.973 | 1.000 |

| ELEM | CPS | WT % ELEM | CPS | WT % ELEM | CPS | WT % ELEM |
|---|---|---|---|---|---|---|
| AL K | 12.1800 | 2.87 | 17.9400 | 4.19 | 11.9900 | 3.02 |
| TI K | 5.5200 | 0.71 | 6.8400 | 0.86 | 5.2500 | 0.79 |
| CR K | 27.6400 | 3.98 | 16.4500 | 2.31 | 21.5800 | 3.69 |
| CO K | 40.6800 | 9.74 | 32.5400 | 7.64 | 27.1700 | 7.42 |
| NI K | 253.1300 | 66.84 | 272.3800 | 71.11 | 193.7500 | 57.84 |
| TA L | 6.5667 | 5.99 | 9.6329 | 8.64 | 4.5259 | 4.70 |
| W L | 4.0775 | 4.33 | 3.9375 | 4.13 | 7.2620 | 8.71 |
| RE L | 4.6000 | 5.56 | 0.9500 | 1.13 | 10.1300 | 13.82 |
| TOTAL | | 100.00 | | 100.00 | | 100.00 |

The calculated $N_{v3B}$ numbers were 1.90 for CMSX-10C and 1.95 for CMSX-10D. Re was maintained at around 5% while W was further reduced to improve stability in these specimens. Alloy Ta was increased since it did not participate in TCP formation and the Ta/W ratio was effectively improved, which assisted with alloy castability. Chromium was reduced in the -10C specimens but increased to 4.0% in the -10D specimens to provide an opportunity to determine the suitability of the Cr levels from a hot corrosion standpoint. Co was reduced in both materials, significantly in the -10D specimen, while Ai+Ti level was also reduced to assist in achieving more complete gamma prime solutioning. Creep-rupture results for the two specimens are reported below in Tables 8 and 9, respectively. Even though the -10D alloy specimens were observed to exhibit full gamma prime solutioning (as opposed to 99.-99.5% for CMSX-10C) the alloys greater Cr content, which necessitated a lower Ai+Ti level, effected lower properties than attained with CMSX-10C. However, both materials exhibited improved alloy stability and higher temperature properties, so that attempts to balance the alloys low and high temperature creep response were favorable.

TABLE 8

CMSX-10C CREEP-RUPTURE

| TEST CONDITION | RUPTURE TIME HOURS | % ELONG. | % RA | FINAL CREEP READING t, hours | FINAL CREEP READING % deformation | TIME IN HOURS TO REACH 1.0% | TIME IN HOURS TO REACH 2.0% |
|---|---|---|---|---|---|---|---|
| 1800° F./36.0 ksi | 556.1 | 31.4 | 30.5 | 555.2 | 26.615 | 316.1 | 376.3 |
| | 636.6 | 43.9 | 37.5 | 636.4 | 38.460 | 416.6 | 455.4 |
| | 609.2 | 23.3 | 34.7 | 607.6 | 19.074 | 410.6 | 460.6 |
| | 635.7 | 44.9 | 45.6 | 635.3 | 34.991 | 407.3 | 443.4 |
| | 612.8 | 43.5 | 38.8 | 611.9 | 41.951 | 409.8 | 438.7 |
| 1850° F./36.0 ksi | 252.2 | 30.2 | 37.8 | 252.0 | 22.033 | 61.1 | 166.3 |
| | 298.1 | 41.3 | 39.0 | 297.6 | 37.953 | 170.3 | 194.8 |
| | 231.1 | 33.6 | 39.5 | 230.2 | 29.689 | 127.8 | 146.0 |
| 1922° F./20.3 ksi | 492.4 | 52.5 | 52.4 | 491.6 | 48.922 | 176.5 | 251.7 |
| | 529.8 | 38.6 | 45.5 | 528.9 | 33.353 | 269.6 | 306.2 |
| | 637.5 | 48.9 | 43.3 | 635.2 | 45.804 | 189.5 | 318.3 |
| 2000° F./18.0 ksi | 258.8 | 35.0 | 41.5 | 258.7 | 32.444 | 74.2 | 127.5 |
| | 293.1 | 49.2 | 44.1 | 292.1 | 42.079 | 145.6 | 170.9 |
| | 221.9 | 43.0 | 48.5 | 220.9 | 33.507 | 55.6 | 123.3 |
| | 266.1 | 35.1 | 44.0 | 264.6 | 33.759 | 113.6 | 143.6 |
| 2050° F./15.0 ksi | 196.6 | 39.7 | 40.3 | 194.1 | 27.755 | 26.0 | 134.8 |
| | 170.4 | 30.1 | 46.3 | 169.2 | 25.624 | 11.1 | 51.4 |
| | 193.2 | 38.1 | 42.9 | 191.9 | 32.288 | 46.5 | 76.5 |
| | 247.3 | 33.1 | 40.5 | 246.0 | 26.494 | 122.0 | 150.8 |

TABLE 9

CMSX-10D CREEP-RUPTURE

| TEST CONDITION | RUPTURE TIME HOURS | % ELONG. | % RA | FINAL CREEP READING t, hours | FINAL CREEP READING % deformation | TIME IN HOURS TO REACH 1.0% | TIME IN HOURS TO REACH 2.0% |
|---|---|---|---|---|---|---|---|
| 1800° F./36.0 ksi | 428.0 | 26.7 | 29.3 | 426.3 | 24.166 | 189.2 | 248.3 |
| 1850° F./36.0 ksi | 141.0 | 23.1 | 26.8 | 140.1 | 20.660 | 57.8 | 79.7 |
| | 140.7 | 14.7 | 26.1 | 140.2 | 13.741 | 56.2 | 77.6 |
| | 166.0 | 17.5 | 28.9 | 165.0 | 15.640 | 76.5 | 100.1 |
| 1922° F./20.3 ksi | 519.9 | 23.8 | 24.9 | 518.9 | 22.608 | 202.0 | 345.6 |
| | 667.0 | 17.6 | 23.7 | 665.2 | 16.819 | 151.8 | 391.4 |
| | 680.3 | 14.9 | 28.2 | 678.9 | 14.476 | 340.2 | 500.3 |
| 2000° F./18.0 ksi | 370.3 | 18.8 | 21.3 | 369.9 | 15.560 | 20.9 | 106.9 |
| | 401.5 | 11.1 | 18.0 | 400.0 | 8.903 | 19.8 | 125.5 |
| | 366.6 | 17.5 | 25.8 | 366.6 | 8.049 | 223.9 | 306.1 |
| 2050° F./15.0 ksi | 465.3 | 12.9 | 20.5 | 465.2 | 12.639 | 61.0 | 305.9 |
| | 338.8 | 9.8 | 24.8 | 337.7 | 9.468 | 30.8 | 204.4 |

Figure 2:
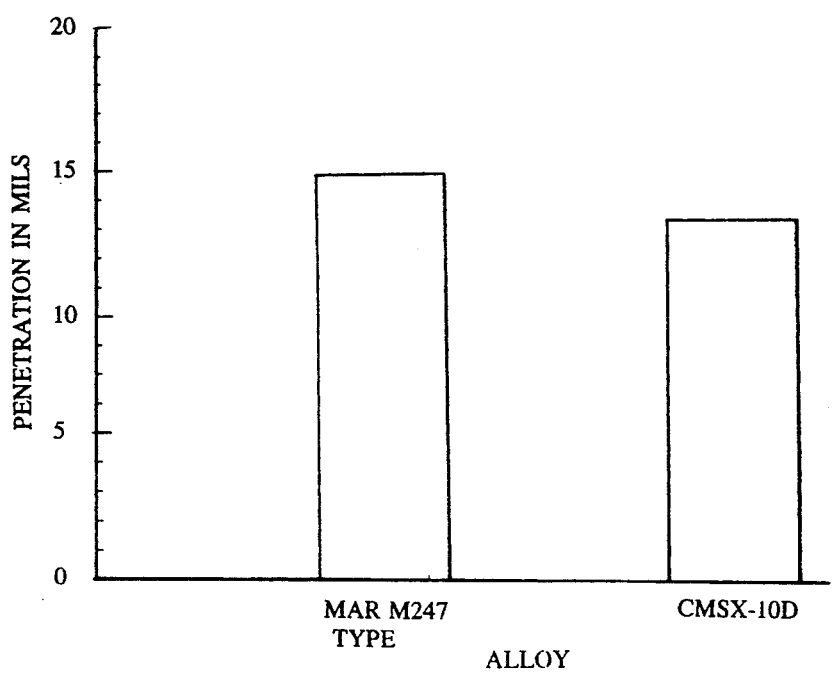
FIG. 2 is a chart of hot corrosion test results performed to 144 hours on another embodiment of the alloy of this invention and on a prior art alloy.

The acceptability of the alloys' low Cr content was confirmed through extremely aggressive short-term burner rig hot corrosion tests performed at 1650° F., 1% sulfur, 10 ppm sea salt condition. FIGS. 1 and 2 illustrate the results for tests performed to 117 and 144 hours for the CMSX-10C and CMSX-10D specimens, respectively. In both cases, the materials performed similar to MAR M 247-type materials, thereby confirming the suitability of the low Cr alloy design concept.

With the above-noted results, another series of alloys, CMSX-10E, -10F, -10G, -10H, -10I, and -12A were designed, produced and evaluated. The alloys explored Re level ranging 4.8–6.3%, 2.2–3.0% Cr level, 4.7–7.6% Co level and the remainder balanced to maintain castability, improve solutionability and improve phasial stability. The $N_{v3B}$ number ranged between 1.81–1.89.

One of the series, CMSX-10F, contained 0.02% C and 0.02% B. These additions were observed to improve casting yield and may have assisted in providing more consistent control of single crystal cast article orientation. However, the melting point depressants, C and B, restricted the specimen's response to solution heat treatment. The CMSX-10F creep-rupture properties are reported in Table 10 below.

TABLE 10

CMSX-10F CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| 1800° F./36.0 ksi | 616.0 | 18.1 | 22.4 | 615.8 | 16.898 | 439.9 | 477.6 |
| | 666.6 | 45.6 | 48.0 | 666.4 | 43.261 | 464.6 | 492.3 |
| | 603.1 | 25.3 | 24.3 | 602.5 | 24.281 | 398.4 | 444.0 |
| 1850° F./36.0 ksi | 243.9 | 19.6 | 28.2 | 243.0 | 18.045 | 129.1 | 160.9 |
| | 285.9 | 26.8 | 32.1 | 285.5 | 25.701 | 187.8 | 206.0 |
| | 258.6 | 19.2 | 29.1 | 258.3 | 18.175 | 168.3 | 189.5 |
| 1922° F./20.3 ksi | 499.5 | 40.0 | 41.0 | 498.5 | 37.756 | 208.2 | 272.6 |
| | 649.2 | 55.6 | 52.9 | 648.3 | 51.045 | 197.6 | 338.8 |
| | 361.0 | 15.8 | 21.9 | 357.7 | 2.599 | 273.2 | 335.7 |
| 2000° F./18.0 ksi | 235.4 | 39.6 | 51.7 | 235.4 | 37.881 | 100.8 | 133.2 |
| | 276.1 | 43.7 | 52.8 | 274.4 | 36.762 | 115.1 | 155.9 |
| | 290.0 | 36.7 | 47.3 | 289.1 | 33.304 | 125.3 | 162.1 |
| 2050° F./15.0 ksi | 255.4 | 28.7 | 36.6 | 255.0 | 27.426 | 67.4 | 131.0 |
| | 255.1 | 33.4 | 43.1 | 254.9 | 31.378 | 46.2 | 102.2 |
| | 254.5 | 25.4 | 33.3 | 254.4 | 23.737 | 50.9 | 118.7 |

The CMSX-10E, G, H and I, plus CMSX-12A creep-rupture specimen results are reported below in Tables 11, 12, 13, 14, and 15, respectively. The results show a general improvement to alloy creep-rupture strength above 1900° F. while maintaining extremely good strength at lower temperatures.

TABLE 11

CMSX-10E CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| 1800° F./36.0 ksi | 664.5 | 31.4 | 36.3 | 663.5 | 30.435 | 436.5 | 470.8 |
| | 604.4 | 35.1 | 36.7 | 603.3 | 33.371 | 253.7 | 355.9 |
| | 582.5 | 41.5 | 36.1 | 581.7 | 39.792 | 78.9 | 329.3 |
| | 553.5 | 35.9 | 37.0 | 552.5 | 33.172 | 326.4 | 357.1 |
| 1850° F./36.0 ksi | 257.9 | 25.3 | 32.0 | 257.0 | 22.734 | 149.4 | 170.3 |
| | 199.2 | 18.4 | 32.1 | 198.6 | 16.261 | 122.4 | 139.4 |
| | 260.5 | 33.6 | 33.4 | 259.7 | 31.315 | 159.9 | 174.0 |
| 1922° F./20.3 ksi | 810.6 | 38.6 | 33.0 | 808.4 | 33.523 | 210.2 | 378.2 |
| | 800.9 | 35.3 | 36.4 | 799.1 | 32.405 | 339.7 | 434.2 |
| | 859.9 | 39.0 | 35.4 | 859.6 | 37.036 | 364.6 | 465.2 |
| 2000° F./18.0 ksi | 362.8 | 27.7 | 29.3 | 362.4 | 24.887 | 98.4 | 177.3 |
| | 411.2 | 29.4 | 27.0 | 409.9 | 26.426 | 173.6 | 218.6 |
| | 369.7 | 15.3 | 28.2 | 368.8 | 12.941 | 170.3 | 221.9 |
| | 379.7 | 26.4 | 26.1 | 379.2 | 27.656 | 177.9 | 206.6 |
| 2050° F./15.0 ksi | 476.9 | 21.8 | 23.4 | 476.3 | 18.233 | 196.6 | 255.9 |
| | 418.4 | 27.5 | 24.7 | 417.5 | 25.854 | 180.0 | 227.3 |
| | 397.7 | 19.0 | 23.8 | 396.8 | 17.522 | 112.6 | 198.2 |

TABLE 12

CMSX-10G CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| 1700° F./55.0 ksi | 671.8 | 19.6 | 28.6 | 670.5 | 14.775 | 447.2 | 508.1 |
| | 693.6 | 26.0 | 24.2 | 691.7 | 21.750 | 441.2 | 493.4 |
| | 724.9 | 23.3 | 29.7 | 723.2 | 19.913 | 464.8 | 520.4 |
| | 582.5 | 18.6 | 20.1 | 581.1 | 15.200 | 77.0 | 356.7 |
| | 681.2 | 20.9 | 24.1 | 679.2 | 19.115 | 56.4 | 314.8 |
| | 538.4 | 21.6 | 17.5 | 538.3 | 17.857 | 242.1 | 308.7 |
| | 523.0 | 17.7 | 21.8 | 522.4 | 14.157 | 235.3 | 308.0 |
| | 569.7 | 17.5 | 19.8 | 568.5 | 15.035 | 287.0 | 354.9 |
| 1800° F./36.0 ksi | 775.2 | 29.6 | 29.3 | 773.8 | 28.826 | 315.0 | 539.9 |
| | 719.7 | 29.5 | 28.5 | 717.8 | 27.266 | 321.2 | 486.4 |
| | 741.6 | 28.0 | 25.9 | 740.3 | 24.870 | 284.5 | 464.2 |
| | 682.8 | 45.6 | 34.7 | 681.1 | 39.289 | 409.1 | 452.4 |

TABLE 12-continued
CMSX-10G CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| | 764.0 | 23.2 | 33.7 | 764.0 | 22.884 | 543.6 | 586.6 |
| | 790.4 | 41.4 | 35.6 | 789.4 | 38.172 | 511.6 | 565.3 |
| | 799.1 | 27.0 | 32.3 | 797.4 | 25.737 | 529.8 | 579.1 |
| 1850° F./36.0 ksi | 354.4 | 19.3 | 30.2 | 351.9 | 16.000 | 246.7 | 271.4 |
| | 344.5 | 28.5 | 31.9 | 344.3 | 26.174 | 220.8 | 241.9 |
| | 315.4 | 23.7 | 30.7 | 315.1 | 23.571 | 183.4 | 205.6 |
| 1922° F./20.3 ksi | 753.4 | 31.7 | 34.8 | 753.2 | 27.914 | 352.3 | 462.1 |
| | 728.0 | 31.5 | 33.5 | 727.1 | 28.362 | 281.1 | 422.1 |
| | 731.6 | 34.3 | 38.8 | 730.5 | 30.770 | 339.3 | 437.3 |
| 1976° F./28.1 ksi | 95.4 | 29.3 | 29.4 | 94.9 | 22.842 | 41.5 | 50.9 |
| | 95.7 | 26.7 | 27.2 | 94.7 | 20.130 | 45.8 | 54.7 |
| | 104.6 | 30.4 | 33.2 | 104.4 | 27.517 | 41.8 | 54.4 |
| | 100.8 | 25.6 | 35.1 | 98.9 | 21.577 | 49.2 | 58.1 |
| | 95.8 | 25.9 | 28.9 | 93.6 | 19.748 | 41.1 | 51.4 |
| | 110.0 | 29.3 | 30.3 | 108.0 | 22.669 | 48.5 | 60.1 |
| | 108.2 | | | | | 43.8 | |
| | 104.8 | | | | | 45.8 | |
| | 104.3 | | | | | 48.6 | |
| 2000° F./18.0 ksi | 464.4 | 23.1 | 21.3 | 463.6 | 18.190 | 257.7 | 293.5 |
| | 411.9 | 18.3 | 23.0 | 410.4 | 16.347 | 103.5 | 227.6 |
| | 370.9 | 27.0 | 38.7 | 369.8 | 25.326 | 7.6 | 47.3 |
| 2012° F./14.5 ksi | 790.2 | 31.2 | 34.9 | 788.7 | 24.939 | 299.9 | 406.0 |
| | 671.4 | 23.6 | 25.7 | 670.3 | 13.397 | 303.3 | 396.3 |
| | 512.1 | 22.6 | 28.1 | 510.4 | 21.094 | 192.5 | 277.7 |
| | 651.7 | 27.4 | 39.7 | 651.3 | 16.328 | 315.7 | 434.7 |
| | 754.6 | 29.7 | 25.4 | 753.1 | 24.032 | 193.8 | 388.7 |
| | 908.3 | 17.7 | 18.3 | — | — | — | — |
| | 758.9 | 30.8 | 26.5 | 758.7 | 24.090 | 388.7 | 438.2 |
| | 740.0 | 19.8 | 20.5 | 739.5 | 16.962 | 316.5 | 426.7 |
| | 671.5 | 26.4 | 23.8 | 669.3 | 15.578 | 359.8 | 412.4 |
| 2050° F./15.0 ksi | 410.8 | 22.9 | 27.4 | 410.0 | 18.655 | 226.5 | 272.2 |
| | 283.5 | 18.0 | 31.2 | 283.5 | 15.303 | 156.4 | 191.2 |
| | 320.0 | 16.8 | 17.4 | 318.3 | 12.979 | 156.4 | 191.2 |
| | 389.7 | 22.0 | 22.1 | 389.7 | 18.488 | 29.9 | 189.1 |
| | 381.4 | 27.0 | 24.1 | 381.1 | 24.758 | 69.5 | 197.9 |
| 2100° F./12.0 ksi | 254.4 | 12.7 | 30.4 | 252.9 | 8.984 | 108.4 | 185.5 |
| | 419.8 | 20.5 | 26.0 | 419.8 | 18.917 | 201.1 | 274.3 |
| 2100° F./12.5 ksi | 331.4 | 16.9 | 21.7 | 331.1 | 15.069 | 25.2 | 83.2 |
| | 367.7 | 19.2 | 23.2 | 366.5 | 17.530 | 76.2 | 177.4 |
| | 387.3 | 16.8 | 17.2 | 386.5 | 12.742 | 236.9 | 282.0 |
| | 383.1 | 34.1 | 32.4 | 381.6 | 32.135 | 10.5 | 164.3 |

TABLE 13
CMSX-10H CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| 1800° F./36.0 ksi | 563.4 | 23.2 | 27.2 | 563.2 | 22.669 | 318.5 | 366.2 |
| | 553.1 | 24.5 | 23.0 | 552.7 | 21.324 | 373.1 | 402.8 |
| | 526.9 | 20.7 | 27.3 | 526.4 | 19.715 | 358.2 | 390.7 |
| | 594.5 | 35.1 | 41.4 | 594.4 | 32.090 | 328.8 | 372.8 |
| 1850° F./36.0 ksi | 242.9 | 24.3 | 20.1 | 242.2 | 20.686 | 107.3 | 155.6 |
| | 221.9 | 17.0 | 21.0 | 221.0 | 14.888 | 115.9 | 150.4 |
| | 223.4 | 21.3 | 21.0 | 221.7 | 19.196 | 128.4 | 144.7 |
| 1922° F./20.3 ksi | 520.6 | 26.1 | 29.3 | 520.4 | 23.183 | 234.3 | 319.1 |
| | 470.4 | 26.3 | 21.2 | 469.2 | 19.333 | 176.1 | 253.2 |
| | 574.7 | 16.8 | 23.0 | 573.0 | 14.411 | 282.1 | 373.0 |
| 2000° F./18.0 ksi | 434.0 | 21.5 | 18.7 | 432.1 | 20.234 | 103.5 | 233.1 |
| | 437.3 | 27.1 | 33.8 | 437.3 | 26.306 | 182.6 | 240.8 |
| | 430.7 | 24.6 | 20.4 | 430.7 | 23.244 | 68.8 | 192.1 |
| | 430.1 | 21.1 | 19.3 | 428.9 | 19.050 | 73.7 | 213.8 |
| 2050° F./15.0 ksi | 366.1 | 16.3 | 12.0 | 365.5 | 11.326 | 239.8 | 273.3 |
| | 384.0 | 17.4 | 16.0 | 382.3 | 12.055 | 168.2 | 242.9 |
| | 420.2 | 12.2/ 13.3 | 418.6 | 10.017 | 127.3 | 273.2 | |

TABLE 14
CMSX-10 I CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| 1800° F./36.0 ksi | 565.1 | 35.2 | 32.0 | 564.8 | 29.774 | 297.0 | 368.9 |

TABLE 14-continued
CMSX-10 I CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| | 581.9 | 32.4 | 29.3 | 580.2 | 28.689 | 371.9 | 402.5 |
| | 514.1 | 24.1 | 30.2 | 514.1 | 21.207 | 318.3 | 358.2 |
| 1850/36.0 | 260.5 | 25.0 | 24.8 | 259.3 | 23.255 | 156.7 | 175.3 |
| | 247.5 | 22.4 | 29.1 | 245.7 | 17.730 | 131.9 | 169.0 |
| | 246.1 | 23.7 | 29.0 | 246.1 | 20.277 | 137.6 | 156.7 |
| 1922/20.3 | 916.3 | 24.9 | 30.3 | 914.8 | 22.465 | 472.9 | 549.3 |
| | 934.8 | 32.2 | 33.0 | 934.8 | 30.165 | 353.7 | 475.2 |
| | 863.6 | 27.8 | 28.5 | 862.9 | 27.057 | 295.6 | 442.5 |
| 1976/28.1 | 116.1 | 19.5 | 20.1 | 116.1 | 19.155 | 57.4 | 70.1 |
| | 65.6 | 22.9 | 20.6 | 64.2 | 21.368 | 17.8 | 26.4 |
| | 91.6 | 23.2 | 25.3 | 90.4 | 15.544 | 37.6 | 49.7 |
| 2000/18.0 | 430.1 | 22.7 | 25.7 | 429.2 | 18.449 | 58.9 | 193.0 |
| | 483.8 | 19.8 | 25.1 | 483.8 | 17.860 | 102.4 | 245.4 |
| 2050/15.0 | 397.7 | 17.9 | 30.0 | 397.3 | 13.264 | 239.8 | 292.9 |
| | 487.7 | 21.4 | 21.9 | 487.1 | 18.854 | 248.2 | 318.4 |
| | 468.3 | 18.4 | 25.5 | 467.9 | 15.800 | 194.1 | 300.1 |
| 2100/12.0 | 501.3 | 10.1 | 15.9 | 498.7 | 0.615 | — | — |
| | 401.3 | 16.8 | 26.3 | 399.7 | 15.429 | 6.6 | 25.5 |
| | 210.6 | 11.5 | 12.7 | 210.3 | 0.373 | — | — |

TABLE 15
CMSX-12A CREEP-RUPTURE

| TEST CONDITION | RUPTURE TIME HOURS | % ELONG. | % RA | FINAL CREEP READING | | TIME IN HOURS TO REACH | |
|---|---|---|---|---|---|---|---|
| | | | | t, hours | % deformation | 1.0% | 2.0% |
| 1800° F./36.0 ksi | 491.9 | 40.2 | 41.6 | 491.8 | 38.605 | 254.0 | 293.7 |
| | 420.4 | 23.5 | 31.9 | 420.3 | 19.299 | 234.9 | 277.9 |
| | 383.4 | 25.3 | 26.2 | 382.9 | 22.920 | 198.1 | 244.3 |
| | 456.2 | 24.1 | 26.1 | 454.5 | 22.582 | 89.9 | 265.5 |
| | 458.0 | 30.7 | 32.7 | 457.1 | 26.155 | 253.2 | 292.8 |
| | 386.8 | 30.1 | 30.4 | 386.3 | 27.031 | 172.7 | 216.9 |
| | 403.7 | 34.5 | 28.8 | 402.7 | 31.033 | 140.2 | 204.9 |
| | 398.7 | 21.6 | 23.5 | 398.4 | 20.277 | 181.1 | 236.1 |
| 1850/36.0 | 208.5 | 32.1 | 40.5 | 208.3 | 31.248 | 100.8 | 119.6 |
| | 189.5 | 21.2 | 25.2 | 189.4 | 20.461 | 99.1 | 116.3 |
| 1922/20.3 | 829.6 | 46.5 | 45.3 | 828.8 | 44.488 | 315.8 | 400.7 |
| | 797.0 | 33.5 | 32.5 | 796.9 | 32.856 | 315.3 | 400.5 |
| 2000/18.0 | 500.3 | 31.7 | 29.6 | 499.2 | 24.922 | 218.4 | 268.5 |
| | 227.6 | 36.5 | 41.2 | 227.1 | 26.825 | 90.6 | 113.9 |
| | 430.4 | 18.5 | 23.3 | 430.4 | 18.180 | 181.0 | 234.1 |
| 2050/15.0 | 424.8 | 17.0 | 27.5 | 423.3 | 15.832 | 263.5 | 301.2 |
| | 366.1 | 26.2 | 42.8 | 365.5 | 20.399 | 146.6 | 197.8 |
| | 400.8 | 18.2 | 25.4 | 400.7 | 16.910 | 184.6 | 251.3 |
| 2100/12.0 | 255.4 | 25.8 | 45.8 | 253.6 | 22.920 | 64.1 | 125.8 |
| | 483.9 | 10.1 | 19.3 | 482.7 | 8.602 | 378.6 | 421.9 |
| | 325.1 | 7.1 | 16.6 | 324.7 | 4.315 | 268.8 | 302.5 |

Varying the primary gamma prime aging treatment was explored with most of the development activity concentrated on achieving optimized gamma prime size and distribution through longer soak times at 1975° F. (see Table 4) since higher temperature aging treatments accelerated TCP phase formation during the aging cycle.

Ten to twenty-one hour soak times at 1975° F. were successful since they provided average gamma prime particles of about 0.5 um dimension. However, it appeared that shorter primary gamma prime aging time at higher temperature may be more practical, once more stable microstructures were defined.

Microchemical SEM WDX needle particle analyses was performed on a failed CMSX-10G creep-rupture specimen. The specimen, tested at 1976° F./28.1 ksi condition, exhibited needles in its microstructure. The results of the analysis are reported in Table 16 below and indicate, again, that the needles formed in this class of material are particularly rich in Re, but are also enrichened with Cr and W.

TABLE 16
CMSX-10G
1976° F./28.1 ksi
104.6 HRS.

| ELEM | K | Z | A | F |
|---|---|---|---|---|
| CRK | 0.0426 | 1.105 | 0.793 | 1.049 |
| COK | 0.0584 | 1.094 | 0.888 | 1.086 |
| NIK | 0.1740 | 1.140 | 0.910 | 1.116 |
| W L | 0.2107 | 0.941 | 0.972 | 1.000 |
| REL | 0.4767 | 0.941 | 0.979 | 1.000 |

NEEDLE CHEMISTRY

| ELEM | CPS | WT % ELEM |
|---|---|---|
| CRK | 113.7000 | 4.63 |
| COK | 112.1100 | 5.54 |
| NIK | 305.1425 | 15.02 |
| W L | 134.8988 | 23.03 |
| REL | 276.4000 | 51.76 |
| | | 100.00 |

A standardized test for resistance to recrystallization was performed on a CMSX-10G test bar. The test method and the results are reported in Table 17 below. The test results indicate that the CMSX-10G specimen exhibited similar resistance to cast process/solution treatment/bonding process recrystallization level in comparison to CMSX-4 alloy.

TABLE 17

* Method: A controlled level of compressive stress is imparted on the entire surface of an as-cast test bar. The bar is then solution heat treated. Following solution treatment, the bar is sectioned and the transverse section is observed metallographically. Depth of recrystallization measurements are taken.
* Evaluation Standards:

| Alloy | Depth of RX | Resistance to RX Anticipated in Blade Castings |
|---|---|---|
| CMSX-4 | .004" | Very Good |
| SX 792 | Entire Bar | Very Poor |
| CMSX-10G | .004" | Very Good |

The CMSX-10Ga -10Ia, -12B,-12C, -10J, -10Ri and -12Ri compositions were defined and evaluated. No creep-rupture properties were generated for the CMSX-10J specimen, although test bars were produced and a solution heat treatment developed. Again, the inclusion of C and B in the -10J composition appeared to have positive effect to single crystal test specimen yield. Additionally, the lower levels of C and B than evaluated in CMSX-10F specimen, particularly lower B, made the material more amenable to solution heat treatment. Ninety-eight to ninety-nine percent gamma prime solutioning was achieved, as opposed to the approximate 95% level typical of the CMSX-10F composition.

The CMSX-10Ga and -10Ia alloys were designed with $N_{v3B}$ numbers of about 1.70. These alloy specimens contain about 2.5% Cr, 3.3–4.0% Co, 5.6–6.0% Re, greater Ta/W ratio, reduced Cb, and reduced Ai+Ti content. Such reduction to Cb+Al+Ti level improved the solutioning characteristics of the materials (see Table 4), plus assisted achievement of increased alloy stability. Both specimens exhibited nearly full gamma prime solutioning.

The lowered $N_{v3B}$ number continued to show effectiveness in providing better creep-rupture capability at temperature greater than 1900° F., while maintaining extremely good creep-strength at lower temperature. CMSX-10Ga test results from specimens produced with improved casting process controls exhibited 700 hours or more life with about 475 hours required to creep to 1.0% for 1800° F./36.0 ksi condition. For higher temperature exposure, the specimen provided the improved average life of about 500 hours at 2050° F./15.0 ksi condition and average 1.0% creep deformation that occurred at about 250 hours, as indicated by the results reported in Table 18 below.

TABLE 18

CMSX-10Ga CREEP-RUPTURE

| TEST CONDITION | RUPTURE TIME HOURS | % ELONG. | % RA | FINAL CREEP READING t, hours | FINAL CREEP READING % deformation | TIME IN HOURS TO REACH 1.0% | TIME IN HOURS TO REACH 2.0% |
|---|---|---|---|---|---|---|---|
| 1800° F./36.0 ksi | 500.7 | 19.9 | 25.2 | 499.7 | 19.541 | 316.5 | 360.1 |
| | 584.2 | 29.1 | 25.4 | 583.9 | 26.395 | 370.0 | 401.8 |
| | 505.1 | 22.6 | 29.8 | 503.7 | 18.212 | 307.4 | 347.3 |
| | 730.9 | 42.0 | 42.8 | 730.7 | 40.216 | 477.6 | 516.1 |
| | | | | | | 460.6 | |
| | | | | | | 428.5 | |
| 1850/36.0 | 184.5 | 41.0 | 33.9 | 183.2 | 37.154 | 82.3 | 94.5 |
| | 291.5 | 27.3 | 29.9 | 290.2 | 19.323 | 191.6 | 207.8 |
| | 279.5 | 33.9 | 32.5 | 278.1 | 29.054 | 155.3 | 180.5 |
| | 323.9 | 30.9 | 36.6 | 322.9 | 29.218 | 194.1 | 217.1 |
| | 326.5+ | 8.9 | 12.6 | — | — | — | — |
| | 295.2+ | 33.3 | 33.5 | — | — | — | — |
| | | | | | | 174.1 | |
| | | | | | | 162.3 | |
| | 300.1+ | 22.8 | 22.4 | — | — | — | — |
| 1976/28.1 | 88.6 | 34.9 | 33.9 | 88.6 | 25.502 | 39.7 | 48.9 |
| | 100.1 | 28.2 | 29.2 | 98.8 | 19.706 | 53.9 | 61.3 |
| | 107.9 | 28.8 | 31.4 | 107.0 | 23.657 | 51.1 | 62.1 |
| | 87.1 | 27.0 | 33.8 | 87.1 | 24.177 | 39.2 | 48.5 |
| | 82.8 | 23.3 | 27.7 | 81.0 | 17.301 | 20.6 | 38.0 |
| | 88.2 | 31.2 | 35.2 | 86.4 | 24.463 | 33.6 | 44.4 |
| | 83.7 | 34.0 | 34.3 | 83.4 | 29.718 | 36.3 | 45.1 |
| | 114.1 | 24.3 | 26.3 | 113.0 | 20.544 | 62.1 | 73.2 |
| | 122.3 | 18.3 | 21.3 | 120.7 | 15.740 | 76.5 | 86.0 |
| | 117.7 | 23.2 | 25.6 | 117.5 | 22.284 | 78.0 | 85.3 |
| | (INTERRUPTED TESTS) | | | 40.2 | 1.036 | 39.9 | — |
| | | | | 43.4 | 1.187 | 42.3 | — |
| | 99.3+ | 60.1 | 38.8 | — | — | — | — |
| | 127.9 | 41.5 | 34.5 | 127.5 | 37.493 | 51.2 | 62.6 |
| | 96.8 | 22.9 | 27.9 | 96.5 | 20.124 | 45.9 | 54.4 |
| | 118.9 | 31.3 | 27.1 | 118.0 | 24.603 | 49.5 | 61.3 |
| | 111.1 | 25.0 | 22.8 | 110.2 | 21.521 | 46.4 | 58.0 |
| | 96.6+ | 24.1 | 22.9 | — | — | — | — |
| | 120.5+ | 25.8 | 29.4 | — | — | — | — |
| | 113.0+ | 27.6 | 20.5 | — | — | — | — |
| 1976/18.85 | (INTERRUPTED TESTS) | | | 261.5 | 1.015 | 260.3 | — |
| | | | | 207.2 | 1.017 | 204.6 | — |
| | 592.1 | 25.8 | 22.4 | 590.4 | 23.596 | 210.1 | 305.9 |
| | 570.7 | 27.2 | 26.9 | 570.7 | 26.289 | 293.3 | 332.6 |
| | 535.5 | 19.3 | 23.9 | 535.2 | 17.513 | 308.2 | 344.2 |
| | | | | | | 240.5 | |
| | | | | | | 307.6 | |

TABLE 18-continued

| | CMSX-10Ga CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| 2050/15.0 | 536.8 | 28.5 | 27.5 | 535.6 | 20.662 | 232.3 | 321.3 |
| | 497.0 | 23.7 | 23.9 | 496.2 | 17.600 | 260.3 | 317.9 |
| | 514.8 | 23.4 | 24.4 | 513.1 | 12.500 | 230.4 | 340.4 |
| | 454.1 | 16.6 | 35.2 | 453.7 | 15.476 | 263.2 | 317.1 |
| | 420.3+ | 33.7 | 33.2 | — | — | — | — |
| | (INTERRUPTED TESTS) | — | — | — | | 239.1 | — |
| | | — | — | — | | 189.6 | — |
| | | — | — | — | | 280.3 | — |
| | 560.1+ | — | 22.9 | — | — | — | — |
| 2012/14.5 | 536.6+ | 7.3 | 8.1 | — | — | — | — |
| | | | | | | 424.6 | |
| 2100/12.0 | 354.1 | 14.8 | 36.5 | 353.8 | 12.646 | 91.2 | 219.1 |
| | 343.4+ | — | 27.2 | — | — | — | — |
| | | | | | | 91.4 | |
| | | | | | | 147.2 | |
| | 491.0+ | — | 16.7 | — | — | — | — |
| 1700/50.0 | + | | | | | | |

+Machined From Blade Specimen

1% creep strength is a significant property. Limiting creep strains to 1.0% and 2.0% is extremely important to gas turbine component design, since a component's usefulness is generally measured by its resistance to creep to an approximate 1-2% level, not its ultimate rupture strength. Many prior art alloys may exhibit attractive rupture strength at the >1900° F. level, however, they lack the level of useful strength, i.e., creep strength to 2.0%, that this invention provides in tandem with its far superior strength in test conditions below 1900° F.

The CMSX-10Ia specimens also provided significantly increased creep strength at the higher temperature extremes, but it did not appear to develop strength as good as the CMSX-10Ga specimens in lower temperature tests, as indicated by the results in Table 19 below.

TABLE 19

| | CMSX-10 Ia CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| 1800° F./36.0 ksi | 532.0 | 34.8 | 32.7 | 530.7 | 33.000 | 259.1 | 312.5 |
| | 474.6 | 23.8 | 29.2 | 473.1 | 22.886 | 201.0 | 269.2 |
| | 374.3 | 20.0 | 21.0 | 372.8 | 19.238 | 171.1 | 214.7 |
| 1850/36.0 | 256.0 | 28.7 | 28.5 | 256.0 | 27.867 | 135.4 | 157.1 |
| | 251.4 | 34.4 | 30.3 | 250.7 | 33.055 | 121.6 | 144.6 |
| | 217.8 | 30.5 | 22.4 | 217.2 | 27.000 | 94.2 | 117.9 |
| 1976/28.1 | 85.7 | 27.5 | 28.9 | 83.8 | 21.754 | 36.9 | 46.2 |
| | 81.9 | 33.6 | 31.8 | 81.0 | 24.384 | 32.1 | 42.1 |
| | 68.9 | 26.1 | 25.8 | 67.6 | 20.960 | 23.1 | 32.4 |
| 2012/14.5 | 930.2 | 10.0 | 14.4 | 928.4 | 9.649 | 104.6 | 455.7 |
| | 844.4 | 17.7 | 23.2 | 842.8 | 16.132 | 339.7 | 502.3 |
| | 864.2 | 15.3 | 11.9 | 862.8 | 14.558 | 179.9 | 453.4 |
| 2050/15.0 | 510.2 | 17.8 | 19.7 | 508.4 | 15.703 | 187.2 | 312.7 |
| | 528.6 | 17.9 | 24.2 | 527.0 | 14.873 | 293.7 | 364.3 |
| | 438.8 | 14.3 | 11.3 | 436.4 | 13.556 | 56.0 | 136.9 |
| 2100/12.0 | 616.4 | 19.0 | 19.1 | 616.3 | 14.112 | 60.0 | 422.5 |
| | 467.7 | 19.1 | 26.1 | 466.0 | 11.373 | 273.6 | 374.8 |

Similarly, CMSX-12B, with Nv3B at 1.80 level and additional chemistry balance as presented in Table 1, provided attractive creep strength at test condition greater than 1900° F., but did not perform quite as well as CMSX-10Ga in lower temperature tests, as indicated by the results reported in Table 20 below.

TABLE 20

| | CMSX-12B CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| 1976° F./28.1 ksi | 91.7 | 15.3 | 17.2 | 91.2 | 14.070 | 43.9 | 56.2 |
| | 72.6 | 19.4 | 23.2 | 72.6 | 17.396 | 27.4 | 36.8 |
| | 14.1 | 5.0 | 1.3 | 12.7 | 2.300 | 8.6 | 11.9 |
| | 98.1 | 16.9 | 17.6 | 96.4 | 13.670 | 17.8 | 38.9 |
| | 108.2 | 25.2 | 24.1 | 108.0 | 22.794 | 43.8 | 58.7 |
| | 106.9 | 24.7 | 24.2 | 106.3 | 21.024 | 46.1 | 60.1 |
| | 104.8 | 24.0 | 26.8 | 104.3 | 20.094 | 45.8 | 58.7 |
| | 104.3 | 26.8 | 21.4 | 103.2 | 22.347 | 48.6 | 60.8 |
| 1800/36.0 | 515.0 | 24.7 | 24.2 | 513.3 | 19.468 | 320.1 | 358.0 |

TABLE 20-continued

| | CMSX-12B CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| | 536.4 | 23.2 | 21.1 | 530.8 | 22.184 | 318.3 | 359.5 |
| | 304.7 | 13.2 | 19.9 | 302.9 | 12.582 | 166.0 | 200.8 |
| 1850/36.0 | 262.6 | 18.4 | 23.1 | 262.4 | 17.660 | 12.5 | 142.2 |
| 2012/14.5 | 1031.3 | 17.2 | 18.5 | 1029.5 | 15.113 | 428.0 | 703.7 |
| | 1078.7 | 15.6 | 20.0 | 1076.7 | 15.217 | 704.2 | 819.2 |
| | 839.4 | 14.9 | 22.8 | 839.2 | 9.282 | 607.6 | 677.7 |
| | 836.9 | 23.2 | 21.0 | 834.8 | 18.024 | 591.1 | 658.5 |
| | 722.0 | 16.4 | 21.1 | 721.9 | 15.913 | 170.8 | 333.6 |
| | 711.3 | 14.5 | 18.8 | 710.8 | 12.490 | 381.9 | 531.5 |
| | 711.9 | 18.3 | 20.0 | 711.4 | 16.201 | 447.7 | 530.7 |
| 2050/15.0 | 507.5 | 10.0 | 10.1 | 507.2 | 9.394 | 70.4 | 360.4 |
| | 434.0 | 17.5 | 16.8 | 434.0 | 13.847 | 241.7 | 309.0 |
| 2100/12.0 | 487.5 | 25.3 | 20.3 | 486.6 | 20.986 | 18.2 | 224.7 |
| | 444.9 | 7.8 | 11.0 | 442.2 | 3.884 | 347.3 | 413.6 |

Alloy composition has the greatest effect on ultimate creep strength. However, some of the variation experienced between alloy derivatives, and particularly for tests exhibiting inconsistent results for a given alloy, can be caused by variation in casting process condition. Casting process thermal gradient variation affects the cast specimen dendrite arm spacing and ultimately, its response to solution heat treatment and primary gamma prime aging treatment. It must, therefore, be recognized that much of the creep-rupture results reported herein may have been generated under non-optimized conditions and may be capable of improvement. Improved casting process control may provide casting microstructures more amenable to solution treatment and study to determine the appropriate primary gamma prime aging treatment to provide the optimum gamma prime particle size, which may result in further mechanical property enhancement.

The CMSX-12C composition was designed to provide a calculated $N_{v3B}$ number of 1.70. The alloy Cr content was designed at 2.8% and Co set at 3.5% aim for this alloy. An attractive Ta/W ratio was maintained while Re content was moderate at 5.8%. The alloy's Ai+Ti content was reduced, in comparison to the CMSX-12A and CMSX-12B specimens, to provide improved alloy response to solution procedure.

Similar to the CMSX-10Ga specimen, the CMSX-12C specimen exhibited an improved balance of creep strength for test condition ranging 1800°–2100° F., as reported in Table 21 below.

TABLE 21

| | CMSX-12C CREEP-RUPTURE | | | | | | |
|---|---|---|---|---|---|---|---|
| | RUPTURE TIME | % | % | FINAL CREEP READING | | TIME IN HOURS TO REACH | |
| TEST CONDITION | HOURS | ELONG. | RA | t, hours | % deformation | 1.0% | 2.0% |
| 1800° F./36.0 ksi | 465.2 | 31.8 | 21.0 | 464.5 | 30.543 | 173.0 | 262.4 |
| | 518.0 | 26.1 | 31.2 | 517.9 | 24.947 | 288.1 | 334.3 |
| | 480.9 | 28.3 | 33.6 | 480.0 | 27.715 | 239.7 | 297.5 |
| | 713.3 | 30.0 | 28.0 | 713.2 | 28.899 | 455.0 | 503.7 |
| 1850/36.0 | 237.7 | 28.2 | 26.8 | 237.7 | 27.054 | 114.4 | 145.3 |
| | 221.2 | 22.9 | 27.3 | 220.7 | 22.491 | 111.3 | 135.2 |
| | 231.7 | 23.3 | 24.7 | 231.0 | 22.614 | 121.0 | 144.7 |
| | 338.9 | 26.2 | 27.0 | 337.5 | 23.256 | 216.0 | 236.3 |
| | 300.1+ | — | — | — | — | — | — |
| | 295.2+ | 33.3 | 33.5 | — | — | — | — |
| 1976/28.1 | 73.2 | 20.8 | 29.1 | 72.2 | 17.768 | 29.3 | 38.9 |
| | 79.0 | 28.1 | 31.8 | 77.4 | 21.533 | 31.4 | 41.4 |
| | 83.8 | 21.6 | 26.5 | 82.3 | 17.860 | 34.2 | 43.8 |
| | 67.6 | 31.2 | 29.8 | 67.5 | 24.177 | 25.5 | 34.6 |
| | 113.0+ | | | | | | |
| | 79.4 | | | | | | 30.8 |
| | 76.2 | | | | | | 32.8 |
| | 68.8 | | | | | | 29.3 |
| | 118.1 | 26.0 | 28.0 | 116.2 | 23.822 | 49.3 | 62.0 |
| | (INTERRUPTED TESTS) | | | — | — | 29.0 | — |
| | | | | — | — | 29.4 | — |
| | | | | — | — | 32.9 | — |
| 1976/18.85 ksi | | | | | | 65.4 | |
| | | | | | | 218.0 | |
| | (INTERRUPTED TESTS) | | | — | — | 271.9 | — |
| | | | | — | — | 168.9 | — |
| | | | | — | — | 116.4 | — |
| | | | | | | 240.5 | |
| 2012/14.5 | 1001.8 | 23.6 | 20.0 | 1000.7 | 23.348 | 249.6 | 542.8 |
| | 865.5 | 20.7 | 26.1 | 864.8 | 18.807 | 418.2 | 569.3 |
| | | | | | | 61.9 | |
| | | | | | | 267.1 | |
| 2050/15.0 | 509.4 | 13.7 | 22.3 | 508.0 | 12.860 | 158.1 | 315.1 |
| | 546.4 | 15.6 | 23.6 | 546.4 | 14.044 | 323.0 | 404.0 |
| | | | | | | 180.8 | |
| | | | | | | 44.2 | |

TABLE 21-continued

| | CMSX-12C CREEP-RUPTURE | | | | | | |
|---|---|---|---|---|---|---|---|
| TEST CONDITION | RUPTURE TIME HOURS | % ELONG. | % RA | FINAL CREEP READING | | TIME IN HOURS TO REACH | |
| | | | | t, hours | % deformation | 1.0% | 2.0% |
| | | | | | | 240.7 | |
| | | | | | | 190.9 | |
| 2100/12.0 | 404.3 | 11.2 | 21.6 | 404.3 | 8.438 | 290.1 | 326.4 |
| | 321.7 | 9.5 | 15.0 | 320.4 | 7.671 | 156.6 | 254.1 |
| | 545.1 | 8.2 | 22.1 | 542.2 | 5.351 | 236.0 | 452.9 |
| | 457.4 | 8.6 | 23.4 | 455.8 | 6.612 | 309.3 | 380.9 |
| 2100° F./12.0 | 371.4+ | 14.2 | 17.1 | — | — | — | — |
| 1750° F./50.0 | 446.9+ | 16.8 | 20.4 | — | — | — | — |
| 1976° F./18.85 | 476.6+ | 19.2 | 27.1 | — | — | — | — |
| | 459.9+ | 30.6 | 30.2 | — | — | — | — |
| 1976° F./28.1 ksi | 120.5+ | 24.1 | 22.9 | — | — | — | — |
| | 99.6+ | 25.8 | 29.4 | — | — | — | — |
| 2050° F./15.0 ksi | 469.8 | — | 30.8 | — | — | — | — |
| | 485.4 | — | 22.7 | — | — | — | — |
| 2012° F./14.5 ksi | | | | | | 638.1 | |
| | | | | | | 521.8 | |
| | | | | | | 267.1 | |
| | | | | | | 61.9 | |
| | | | | | | 395.7 | |

+Machined From Blade Specimens

With improved casting process controls, this specimen has shown the following 1.0% longitudinal creep strengths, as reported in Table 22 below.

TABLE 22

| Test Condition | Time to 1.0% Strain Hrs |
|---|---|
| 1800° F./36.0 ksi | 455 |
| 2100° F./12.0 ksi | 309.3 |

Both alloys provide similarly greater rupture strength than CMSX-4 alloy at condition to 1976° F. Respective improvements to metal temperature capability are reported below in Table 23.

TABLE 23

| Temperature | Approx. Strength Advantage Relative to CMSX-4 |
|---|---|
| 1800° F. | 40° F. |
| 1850° F. | 45° F. |
| 1976° F. | 43° F. |
| Based on 1.0% creep strength, | |
| the respective approximate advantages are: | |
| 1800° F. | +46° F. |
| 1850° F. | +60° F. |
| 1976° F. | +55° F. |
| Note that the comparison is not density corrected. | |

For test temperature above 1976° F., the test results indicate that the CMSX-10Ga and CMSX-12C specimens provided slightly lower strength than CMSX-4 alloy. The reduction in strength advantage for these alloys is believed to be the result of TCP phase formation. To address this issue, the alloys CMSX-10Gb, CMSX-10L, CMSX-12Ca, and CMSX-12E, are designed with $N_{v3B}$ number as low as 1.50 (see Table 1) to provide greater phasial stability, and effect much improved high temperature creep-strength while maintaining most of the creep advantage demonstrated for the 1800°-1976° F. test regime.

The CMSX-10Ri and CMSX-12Ri compositions were designed at the 1.91 and 1.92 $N_{v3B}$ levels, respectively. These specimens were subjected to the most extensive testing of properties. They were designed with 2.65% and 3.4% respective Cr levels, with other features remaining similar to the aforementioned alloy design considerations. The properties generated for these two materials confirm the overall invention design concept with the other material iterations able to provide similar physical properties and relatively better blends of mechanical properties.

The CMSX-10Ri and CMSX-12Ri specimens' respective creep-rupture capabilities are reported below in Tables 24 and 25.

TABLE 24

| | CMSX-10(Ri) CREEP-RUPTURE | | | | | | |
|---|---|---|---|---|---|---|---|
| TEST CONDITION | RUPTURE TIME HOURS | % ELONG. | % RA | FINAL CREEP READING | | TIME IN HOURS TO REACH | |
| | | | | t, hours | % deformation | 1.0% | 2.0% |
| 1675° F./75.0 ksi | 227.3 | 21.2 | 33.8 | 225.4 | 14.359 | 52.8 | 131.5 |
| | 231.6 | 19.3 | 31.0 | 231.3 | 16.671 | 51.0 | 125.1 |
| | 223.4 | 17.0 | 22.3 | 223.3 | 15.360 | 68.5 | 126.6 |
| 1750/50.0 | 425.9 | 18.3 | 33.7 | 425.6 | 16.047 | 303.4 | 334.7 |
| | 428.0 | 18.4 | 29.7 | 427.3 | 16.229 | 309.2 | 343.0 |
| | 460.8 | 17.1 | 25.7 | 459.0 | 15.308 | 314.7 | 360.3 |
| 1800/36.0 | 698.5 | 39.9 | 34.3 | 696.8 | 36.980 | 492.8 | 521.5 |
| | 676.3 | 28.3 | 33.3 | 674.5 | 27.221 | 479.0 | 513.8 |
| | 692.9 | 38.5 | 31.3 | 692.2 | 36.494 | 469.3 | 504.9 |
| 1850/36.0 | 291.2 | 34.1 | 33.1 | 291.1 | 31.774 | 194.1 | 210.4 |
| | 260.0 | 29.3 | 32.1 | 258.8 | 25.321 | 170.2 | 186.4 |
| | 272.3 | 34.5 | 31.8 | 271.1 | 30.940 | 169.3 | 187.1 |
| 1850/27.56 | 614.0 | 52.0 | 42.0 | 613.5 | 50.482 | 365.8 | 415.5 |
| | 576.3 | 49.7 | 39.0 | 575.9 | 49.183 | 345.1 | 368.2 |
| | 481.1 | 40.4 | 35.4 | 480.7 | 38.294 | 309.3 | 335.4 |

TABLE 24-continued

CMSX-10(Ri) CREEP-RUPTURE

| TEST CONDITION | RUPTURE TIME HOURS | % ELONG. | % RA | FINAL CREEP READING t, hours | FINAL CREEP READING % deformation | TIME IN HOURS TO REACH 1.0% | TIME IN HOURS TO REACH 2.0% |
|---|---|---|---|---|---|---|---|
| 1976/28.1 | 76.2 | 23.3 | 31.7 | 75.9 | 22.130 | 38.6 | 46.7 |
|  | 80.5 | 19.0 | 26.3 | 79.8 | 14.665 | 44.3 | 51.3 |
|  | 99.7 | 26.2 | 28.1 | 98.9 | 23.480 | 40.4 | 54.0 |
|  | (INTERRUPTED TESTS) |  |  |  |  | 41.4 | — |
|  |  |  |  |  |  | 37.0 | — |
|  |  |  |  |  |  | 40.5 | — |
| 1976/18.85 | 265.6 | 29.5 | 35.7 | 264.7 | 29.010 | 158.7 | 184.8 |
|  | 278.8 | 51.4 | 38.8 | 278.1 | 46.026 | 82.0 | 155.0 |
|  | (INTERRUPTED TESTS) |  |  |  |  | 139.7 | — |
|  |  |  |  |  |  | 128.8 | — |
|  |  |  |  |  |  | 100.1 | — |
| 2012/14.5 | 490.8 | 40.2 | 33.5 | 490.5 | 37.678 | 286.5 | 335.3 |
|  | 447.0 | 37.0 | 41.5 | 445.0 | 32.814 | 291.4 | 319.9 |
|  | (INTERRUPTED TESTS) | — | — | — | — | 113.5 | — |
|  |  |  |  |  |  | 205.7 | — |
|  |  |  |  | — | — | 202.2 | — |
| 2050/15.0 | 251.9 | 33.6 | 35.9 | 250.0 | 25.559 | 100.0 | 149.5 |
|  | 318.9 | 27.1 | 30.0 | 318.2 | 23.149 | 177.5 | 221.2 |
|  | (INTERRUPTED TESTS) |  |  | — | — | 181.0 | — |
|  |  |  |  |  |  | 95.5 | — |
|  |  |  |  | — | — | 34.5 | — |
| 2100/12.0 | 400.3 | 17.9 | 27.2 | 400.1 | 17.877 | 102.8 | 225.0 |
|  | 362.1 | 15.3 | 22.9 | 361.8 | 14.986 | 125.7 | 217.2 |
|  | 389.5 | 19.9 | 24.0 | 388.2 | 19.510 | 41.1 | 180.7 |

TABLE 25

CMSX-12(Ri) CREEP-RUPTURE

| TEST CONDITION | RUPTURE TIME HOURS | % ELONG. | % RA | FINAL CREEP READING t, hours | FINAL CREEP READING % deformation | TIME IN HOURS TO REACH 1.0% | TIME IN HOURS TO REACH 2.0% |
|---|---|---|---|---|---|---|---|
| 1675° F./75.0 ksi | 209.8 | 22.3 | 23.1 | 209.3 | 19.958 | 2.6 | 46.3 |
|  | 191.4 | 14.3 | 17.4 | 189.7 | 12.483 | 1.6 | 42.5 |
|  | 189.6 | 22.0 | 22.8 | 188.3 | 19.080 | 1.5 | 22.3 |
| 1750/50.0 | 448.1 | 26.7 | 26.6 | 447.9 | 26.054 | 302.3 | 335.5 |
|  | 403.1 | 19.0 | 26.9 | 401.9 | 18.566 | 210.0 | 290.2 |
|  | 435.0 | 19.4 | 26.9 | 434.4 | 18.503 | 89.1 | 284.1 |
| 1800/36.0 | 604.5 | 34.7 | 29.9 | 604.3 | 34.170 | 349.4 | 407.1 |
|  | 583.6 | 37.0 | 32.0 | 581.3 | 30.443 | 391.3 | 420.6 |
|  | 627.0 | 25.3 | 29.7 | 627.0 | 24.417 | 412.4 | 455.8 |
| 1850/36.0 | 302.9 | 33.1 | 31.3 | 301.7 | 29.034 | 198.9 | 215.1 |
|  | 314.4 | 32.0 | 27.1 | 312.7 | 27.479 | 201.4 | 220.2 |
| 1976/28.1 | 90.0 | 19.7 | 29.2 | 88.5 | 16.627 | 33.9 | 48.8 |
|  | 91.5 | 30.3 | 31.9 | 90.6 | 29.001 | 37.3 | 47.9 |
|  | 68.6 | 35.3 | 32.2 | 68.4 | 28.869 | 17.3 | 27.6 |
|  | (INTERRUPTED TESTS) |  |  |  |  | 43.7 | — |
|  |  |  |  |  |  | 41.4 | — |
|  |  |  |  |  |  | 38.7 | — |
| 2012/14.5 | 324.1 | 31.4 | 30.8 | 323.9 | 24.403 | 160.1 | 207.7 |
|  | 481.4 | 30.9 | 31.9 | 481.1 | 29.581 | 129.9 | 299.6 |
|  | 551.7 | 29.9 | 31.1 | 549.2 | 25.622 | 304.4 | 375.5 |
|  | (INTERRUPTED TESTS) |  |  |  |  | 256.1 | — |
|  |  |  |  |  |  | 182.8 | — |
|  |  |  |  |  |  | 101.5 | — |
| 2050/15.0 | 243.4 | 36.1 | 35.0 | 243.3 | 20.614 | 143.1 | 174.2 |
| 2100/12.0 | 374.8 | 12.1 | 20.3 | 374.7 | 11.743 | 166.6 | 280.4 |
|  | 463.6 | 15.4 | 25.9 | 463.3 | 13.594 | 245.7 | 363.3 |
|  | 488.0 | 20.3 | 25.9 | 487.1 | 19.550 | 25.7 | 118.9 |

The method and results of W and Re microstructural segregation investigation undertaken on fully solutioned and partially solutioned CMSX-12Ri test specimens are reported in Table 26 below. The investigation indicated that it is desirable to minimize the amount of microstructure-contained residual eutectic and that for fully solutioned specimens, the solution treatments developed for the invention are successful in minimizing elemental segregation, which is important in attaining optimized mechanical properties and microstructural stability.

TABLE 26

Alloy: CMSX-12 Ri
Test Specimen: ⅜" Diameter Solid Bar
Specimen Condition: Fully Solutioned
                       Solutioned with 2.0% Residual Eutectic
Analyses Method: Microprobe Analyses
+Random array of 350 points across a section at right angles to the growth direction
+Seven line scans, 51° apart, 50 point analyses per line
The standard deviation of the W and Re measurements are the measure of homogeneity Results:

TABLE 26-continued

| CMSX-12 Ri | Standard Deviations | |
|---|---|---|
| | W | Re |
| Fully Solutioned | 0.27 | 0.50 |
| 2% Residual Eutectic | 0.36 | 0.90 |
| Comparison Typical CMSX-4 | 0.57 | 0.60 |

Table 27 below reports results of burner rig hot corrosion test undertaken with the CMSX-12Ri specimen. The measurements were taken at the bar location which experienced the maximum attack, i.e., 1652° F. location, with the results showing the DS MAR M 002 alloy experienced approximately 20× more metal loss than the CMSX-12Ri specimen. Visual observation showed a similar result for the CMSX-10Ri alloy. Both CMSX-10Ri alloy and CMSX-12Ri alloy showed similar resistance to attack as CMSX-4 alloy based on visual specimen review at 60, 90 and 120 hours.

TABLE 27

HOT CORROSION
METHOD
 +Burner Rig
  1742° F. (950° C.)
  2 ppm salt, standard fuel
 +Measurements taken at point of maximum attack which was at 1652° F. (900° C.)
 +Measurements reported were taken at the average minimum diameter of useful metal
RESULTS
 +90 Hour Test

| Alloy | Initial Dia. | Post Test Useful Dia. | Metal Loss Per Side |
|---|---|---|---|
| DS Mar M 002 | 6.88 mm | 5.14 mm | .87 mm (.034″) |
| CMSX-12Ri | 6.86 mm | 6.78 mm | .04 mm (.0016″) |

Table 28 below reports the results of cyclic oxidation tests undertaken at 2012° F. with March 1 gas velocity. The CMSX-12Ri specimen was similarly resistant to oxidation attack at 2012° F., however, it was not as good as CMSX-4 at approximately 1886° F. exposure.

TABLE 28

Cyclic Oxidation Test

•15 Minute Cycles to 2012° F. (1100° C.),
 Cooled to Ambient Between Cycles
 Mach 1 Gas Velocity
•89 Hours Total With 77 Hours at 2012° F.

| | | |
|---|---|---|
| RESULT: | at 1100° C. | CMSX-12 Ri Approx. 0.1 mm loss per side for every 300 cycles |
| | | CMSX-4 Approx. 0.1 mm loss per side for every 380 cycles |
| | at 1030° C. | CMSX-12 Ri Approx. .105 mm loss per side after 355 cycles |
| | | CMSX-4 Approx. .03 mm loss per side after 355 cycles |

CMSX-12Ri elevated temperature tensile data is reported in Table 29 below, while the results of impact tests are reported in Table 30 below. The CMSX-12Ri elevated temperature impact strength minimum is similar to CMSX-4 and its maximum occurring at 1742° F., is better.

TABLE 29

TENSILE DATA
CMSX-12 Ri Alloy

| Test Temp °F. | LAUE | 0.1% Yld ksi | 0.2% Yld ksi | UTS ksi | Elong % | RA % |
|---|---|---|---|---|---|---|
| 1382 | 2.3° | 150.0 | 160.8 | 188.7 | 13 | 14 |
| 1382 | 2.3° | 153.6 | 165.1 | 190.0 | 13 | 15 |
| 1562 | 6.2° | 136.5 | 130.8 | 152.3 | 27 | 24 |
| 1562 | 6.2° | 135.0 | 128.9 | 160.1 | 25 | 23 |
| 1742 | 5.6° | 92.7 | 89.2 | 125.3 | 24 | 30 |
| 1742 | 5.6° | 99.9 | 106.2 | 129.2 | 24 | 32 |
| 1922 | 3.8° | 69.5 | 74.3 | 104.1 | 19 | 36 |
| 1922 | 3.8° | 72.4 | 77.6 | 106.0 | 19 | 36 |

TABLE 30

IMPACT DATA
CMSX-12 Ri
0.35 Inch Diameter Plain Cylindrical Specimens

| | Test Temperature, °F. | | | |
|---|---|---|---|---|
| | 1382 | 1562 | 1742 | 1922 |
| CMSX-12 Ri (1 only) | 26 J | 20 J | 60 J | 32 J |
| CMSX-4 (Ave. of 4) | 26 J | 21 J | 42 J | 45 J |

Further Impact Property Comparison
•CMSX-2-Min. Impact Strength 16.5 Joules
•SRR 99-Min. Impact Strength 20 Joules The results of CMSX-12Ri low cycle fatigue tests undertaken at 1382° F. and 1742° F. test conditions, with R=0, are reported in Table 31 below. The data indicates that CMSX-12Ri performance is similar to CMSX-4 at 1382° F. condition, while the alloy exhibits approximately 2.5 times the typical CMSX-4 life at 1742° F. condition.

TABLE 31

LOW CYCLE FATIGUE
CMSX-12 Ri Alloy
R = 0 (zero to maximum stressing)

| 1382° F. (750° C.) | | 1742° F. (950° F.) | |
|---|---|---|---|
| PEAK STRESS ksi (MPa) | Cycles | PEAK STRESS ksi (MPa) | Cycles |
| 142 (980) | 8686 | 110 (760) | 4427 |
| 130 (900) | 11950 | 99 (680) | 15510 |
| 125 (860) | 20810 | 87 (600) | 37430 |
| 119 (820) | >100000 | 75 (520) | 92580 |

•Performance is similar to CMSX-4 at 1382° F. (750° C.)
•Compared to CMSX-4, at 1742° F. (950° C.) and in the 20000 cycle region, CMSX-12Ri exhibits 2.5 times life or 15% on strength.

Notched low cycle fatigue test results show the CMSX-12Ri is 2½ times better than CMSX-4 out to about 3000 cycles, while at 50000 cycles and above, the alloy performance is similar to CMSX-4. The results of these tests performed at 1382° F., $K_t=2.0$ and R=0 test condition, are reported in Table 32 below.

TABLE 32

NOTCHED LOW CYCLE FATIGUE
CMSX-12Ri Alloy
1382° F. (750° C.), $K_t = 2.0$, R = 0

| PEAK STRESS ksi (MPa) | CYCLES |
|---|---|
| 113.13 (780) | 4879 |
| 107.33 (740) | 9784 |
| 95.72 (660) | 28470 |
| 84.12 (580) | 49810 |
| 81.22 (560) | |
| 78.32 (540) | >115,000 |

TABLE 32-continued

NOTCHED LOW CYCLE FATIGUE
CMSX-12Ri Alloy
1382° F. (750° C.), $K_t$ = 2.0, R = 0

| PEAK STRESS ksi (MPa) | CYCLES |
|---|---|
| 75.42 (520) | >115,000 |

•Results are 2½ times better than CMSX-4 out to about 30000 cycles.
•Results are similar to CMSX-4 at 50000 cycles, and above.

High cycle fatigue test results for the CMSX-10Ri alloy are reported in Table 33 below. For 1742° F., 100 Hz, R=0 test condition, the alloy exhibited about 2½ times the typical CMSX-4 lives.

TABLE 33

HIGH CYCLE FATIGUE CMSX-10Ri Alloy
1742° F. (950° C.), 100 Hz., R = 0

| PEAK STRESS ksi (MPa) | CYCLES ($N_f$) |
|---|---|
| 81.22 (560) | $15.2 \times 10^6$ |
| 92.82 (640) | $3.59 \times 10^6$ |
| 104.43 (720) | $0.6 \times 10^6$ |

*Lives are 2½ times better than CMSX-4

The CMSX-10Ri and CMSX-12Ri test data indicates that adequate hot corrosion and oxidation resistance can be achieved with extremely low alloy chromium content. Additionally, extremely good thermo-mechanical fatigue tensile and impact strengths are apparent with the superalloys of this invention.

The results of alloy specimen density measurements are reported in Table 34 below.

TABLE 34

SINGLE CRYSTAL ALLOY DENSITY DATA

| ALLOY | DENSITY Lbs/In³ |
|---|---|
| CMSX-10A | .324 |
| CMSX-10B | .324 |
| CMSX-10C | .325 |
| CMSX-10D | .325 |
| CMSX-10E | .325 |
| CMSX-10F | .323 |
| CMSX-10G | .322 |
| CMSX-10Ga | .322 |
| CMSX-10H | .324 |
| CMSX-10I | .322 |
| CMSX-10Ia | .322 |
| CMSX-10J | .327 |
| CMSX-10Gb (10K) | .329 |
| CMSX-12A | .323 |
| CMSX-12B | .325 |
| CMSX-12C | .326 |
| CMSX-12Ca (12D) | .326 |
| CMSX-10Ri | .326 |
| CMSX-10 Ri | .323 |

The alloys of this invention are amenable to HIP processing. Specimens HIP treated as reported in Table 35 below, showed nearly complete pore closure and absence from incipient melting.

TABLE 35

HIP condition

1. Heat Specimens in the HIP vessel to 2455° F. at mininum Argon pressure (approximately 1500 psi) and hold for 4 hours while maintaining 2455° F./1500 psi condition.
2. While maintaining the 2455° F. operating temperature, increase the Argon pressure over 1 hour to 20 ksi. Soak specimens at 2455° F./20 ksi condition fo 4 hours.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

What is claimed is:

1. A nickel-based superalloy comprising the following elements in percent by weight:

| | |
|---|---|
| Rhenium | about 5.0–7.0 |
| Chromium | about 1.8–4.0 |
| Cobalt | about 1.5–9.0 |
| Tantalum | about 7.0–10.0 |
| Tungsten | about 3.5–7.5 |
| Aluminum | about 5.0–7.0 |
| Titanium | about 0.1–1.2 |
| Columbium | about 0–0.5 |
| Molybdenum | about 0.25–2.0 |
| Hafnium | about 0–0.15 |
| Carbon (Incidental Impurity) | about 0–0.04 |
| Nickel + Other Incidental Impurities | balance | said superalloy having a phasial stability number $N_{v3B}$ less than about 2.10.

2. The superalloy of claim 1 further comprising the following elements in percent by weight:

| | |
|---|---|
| Boron | about 0–0.01 |
| Yttrium | about 0–0.01 |
| Cerium | about 0–0.01 |
| Lanthanum | about 0–0.01 |

3. The superalloy of claim 1 further comprising the following elements in percent by weight:

| | |
|---|---|
| Manganese | about 0–0.04 |
| Silicon | about 0–0.05 |
| Zirconium | about 0–0.01 |
| Sulfur | about 0–0.001 |
| Vanadium | about 0–0.10 |

4. The superalloy of claim 1 wherein said superalloy has a phasial stability number $N_{v3B}$ less than 1.85.

5. The superalloy of claim 1 wherein said superalloy has a chromium content of from about 1.8 to about 3.0 percent by weight.

6. The superalloy of claim 1 wherein said superalloy has a rhenium content of from about 5.5 to about 6.5 percent by weight.

7. The superalloy of claim 1 wherein said superalloy has a cobalt content of from about 2.0 to about 5.0 percent by weight.

8. The superalloy of claim 1 wherein said superalloy has an increased resistance to creep under high stress, high temperature conditions up to about 1975° F.

9. A single crystal article made from the superalloy of claim 1.

10. The single crystal article of claim 9 wherein the article is a component for a turbine engine.

11. The article of claim 10 wherein the component is a gas turbine blade or gas turbine vane.

12. A nickel-based superalloy comprising the following elements in percent by weight:

| | |
|---|---|
| Rhenium | 5.5–6.5 |
| Chromium | 1.8–3.0 |
| Cobalt | 2.0–5.0 |
| Tantalum | 8.0–10.0 |
| Tungsten | 3.5–6.5 |
| Aluminum | 5.3–6.5 |
| Titanium | 0.2–0.8 |
| Columbium | 0–0.3 |
| Molybdenum | 0.25–1.5 |
| Hafnium | 0.02–0.05 |
| Carbon (Incidental Impurity) | about 0–0.04 |
| Nickel + other Incidental Impurities | balance | said superalloy having a phasial stability number $N_{v3B}$ less than about 1.75.

13. The superalloy of claim 12 further comprising the following elements in percent by weight:

| | |
|---|---|
| Boron | 0–0.01 |
| Yttrium | 0–0.01 |
| Cerium | 0–0.01 |
| Lanthanum | 0–0.01 |

14. The superalloy of claim 12 further comprising the following elements in percent by weight:

| | |
|---|---|
| Manganese | 0–0.04 |
| Silicon | 0–0.05 |
| Zirconium | 0–0.01 |
| Sulfur | 0–0.001 |
| Vanadium | 0–0.10 |

15. A single crystal article made from the superalloy of claim 12.

16. A single crystal casting to be used under high stress, high temperature conditions characterized by an increased resistance to creep under such conditions, said casting being made from a nickel-based superalloy comprising the following elements in percent by weight:

| | |
|---|---|
| Rhenium | about 5.0–7.0 |
| Chromium | about 1.8–4.0 |
| Cobalt | about 1.5–9.0 |
| Tantalum | about 7.0–10.0 |
| Tungsten | about 3.5–7.5 |
| Aluminum | about 5.0–7.0 |
| Titanium | about 0.1–1.2 |
| Columbium | about 0–0.5 |
| Molybdenum | about 0.25–2.0 |
| Hafnium | about 0–0.15 |
| Carbon (Incidental Impurity) | about 0–0.04 |
| Nickel + other Incidental Impurities | balance |

| | |
|---|---|
| Rhenium | about 5.0–7.0 |
| Chromium | about 1.8–4.0 |
| Cobalt | about 1.5–9.0 |
| Tantalum | about 7.0–10.0 |
| Tungsten | about 3.5–7.5 |
| Aluminum | about 5.0–7.0 |
| Titanium | about 0.1–1.2 |
| Columbium | about 0–0.5 |
| Molybdenum | about 0.25–2.0 |
| Hafnium | about 0–0.15 |

-continued

| | |
|---|---|
| Carbon (Incidental Impurity) | about 0–0.04 |
| Nickel + Other Incidental Impurities | balance | said superalloy having a phasial stability number $N_{v3B}$ less than about 2.10.

17. The single crystal casting of claim 16 wherein said superalloy further comprises the following elements in percent by weight:

| | |
|---|---|
| Boron | about 0–0.01 |
| Yttrium | about 0–0.01 |
| Cerium | about 0–0.01 |
| Lanthanum | about 0–0.01 |

18. The single crystal casting of claim 16 further comprising the following elements in percent by weight:

| | |
|---|---|
| Manganese | about 0–0.04 |
| Silicon | about 0–0.05 |
| Zirconium | about 0–0.01 |
| Sulfur | about 0–0.001 |
| Vanadium | about 0–0.10 |

19. The single crystal casting of claim 16 wherein said superalloy has a phasial stability number $N_{v3B}$ less than 1.85.

20. The single crystal casting of claim 16 wherein said superalloy has a chromium content of from about 1.8 to about 3.0 percent by weight.

21. The single crystal casting of claim 20 wherein said superalloy has a rhenium content of from about 5.5 to about 6.5 percent by weight.

22. The single crystal casting of claim 21 wherein said superalloy has a cobalt content of from about 2.0 to about 5.0 percent by weight.

23. The single crystal casting of claim 16 wherein said superalloy has an increased resistance to creep under high stress, high temperature conditions up to about 1975° F.

24. The single crystal casting of claim 16 wherein said casting has been aged at a temperature of from about 1950° F. to about 2125° F. for about 1 to about 20 hours.

25. The single crystal casting of claim 16 wherein said casting is a component for a turbine engine.

26. The single crystal casting of claim 16 wherein said casting is a gas turbine blade.

27. The single crystal casting of claim 16 wherein said casting is a gas turbine vane.

28. A single crystal casting to be used under high stress, high temperature conditions up to about 1975° F. characterized by an increased resistance to creep under such conditions, said casting being made from a nickel-based superalloy comprising the following elements in percent by weight:

| | |
|---|---|
| Rhenium | about 5.5–6.5 |
| Chromium | about 1.8–3.0 |
| Cobalt | about 2.0–5.0 |
| Tantalum | about 8.0–10.0 |
| Tungsten | about 3.5–6.5 |
| Aluminum | about 5.3–6.5 |
| Titanium | about 0.2–0.8 |
| Columbium | about 0–0.3 |
| Molybdenum | about 0.25–1.5 |

-continued

| | |
|---|---|
| Hafnium | about 0.02–0.05 |
| Carbon | about 0–0.04 |
| Boron | about 0–0.01 |
| Yttrium | about 0–0.01 |
| Cerium | about 0–0.01 |
| Lanthanum | about 0–0.01 |
| Manganese | about 0–0.04 |
| Silicon | about 0–0.05 |
| Zirconium | about 0–0.01 |
| Sulfur | about 0–0.001 |
| Vanadium | about 0–0.10 |

-continued

| | |
|---|---|
| Nickel | balance | said superalloy having a phasial stability number $N_{v3B}$ less than about 1.75.

29. The single crystal casting of claim 28 wherein said casting has been aged at a temperature of from 1950° F. to 2125° F. for 1 to 20 hours.

30. The single crystal casting of claim 28 wherein said casting is a component for a turbine engine.

31. The single crystal casting of claim 28 wherein said casting is a gas turbine blade.

32. The single crystal casting of claim 28 wherein said casting is a gas turbine vane.

* * * * *